United States Patent
Liu et al.

(10) Patent No.: US 12,544,575 B2
(45) Date of Patent: Feb. 10, 2026

(54) BIOELECTRIC NEUROMODULATION FOR HEMATOPOIESIS REGULATION DURING CHEMOTHERAPY

(71) Applicants: THE REGENTS OF THE UNIVERSITY OF CALIFORNIA, Oakland, CA (US); NATIONAL CHENG KUNG UNIVERSITY, Tainan (TW)

(72) Inventors: Wentai Liu, Los Angeles, CA (US); Meng-Ru Shen, Tainan (TW); Li-Hsien Chen, Tainan (TW); Ya-Ting Hsu, Kaohsiung (TW)

(73) Assignees: THE REGENTS OF THE UNIVERSITY OF CALIFORNIA, Oakland, CA (US); NATIONAL CHENG KUNG UNIVERSITY, Tainan (TW)

( * ) Notice: Subject to any disclaimer, the term of this patent is extended or adjusted under 35 U.S.C. 154(b) by 319 days.

(21) Appl. No.: 18/205,274

(22) Filed: Jun. 2, 2023

(65) Prior Publication Data
US 2024/0017070 A1 Jan. 18, 2024

Related U.S. Application Data

(63) Continuation of application No. PCT/US2021/062243, filed on Dec. 7, 2021.
(Continued)

(51) Int. Cl.
*A61N 1/36* (2006.01)
*A61N 1/05* (2006.01)

(52) U.S. Cl.
CPC ....... *A61N 1/36103* (2013.01); *A61N 1/0551* (2013.01); *A61N 1/36175* (2013.01); *A61N 1/36178* (2013.01)

(58) Field of Classification Search
CPC .............. A61N 1/0551; A61N 1/36002; A61N 1/3603; A61N 1/3606; A61N 1/36103;
(Continued)

(56) References Cited

U.S. PATENT DOCUMENTS 8,926,606 B2 1/2015 Davalos
2010/0191311 A1 7/2010 Scheiner
(Continued)

OTHER PUBLICATIONS

European Patent Office (Epo), Communication Extended European Search Report issued Apr. 4, 2024, related European patent application No. 21904267.8, pp. 1-9, with claims searched, 10-13.
(Continued)

*Primary Examiner* — Amanda K Hulbert
(74) *Attorney, Agent, or Firm* — O'BANION & RITCHEY LLP; John P. O'Banion

(57) ABSTRACT

A device and method are taught for stimulating sympathetic nerves toward mitigating negative impacts to hematopoiesis. An autonomic nerve actuator and stimulator system with a graphic user interface (GUI), controller circuit which converts treatment parameters into a series of Building Block Waveforms (BBW) which are output to Current/Voltage Driver Circuitry (CDC) whose electrical stimulus (ES) outputs are coupled to one or more electrodes and/or electrode arrays positioned proximal specific nerve situations. The use of this in combination with conventional chemotherapy treatments, such as use of carboplatin, was found to significantly enhance hematopoiesis, with improvements in white and red blood cell counts, platelet concentration and hemoglobin concentration, in addition to other measurable characteristics which increased survival rates in the experimental groups tested.

48 Claims, 31 Drawing Sheets

Related U.S. Application Data

(60) Provisional application No. 63/122,794, filed on Dec. 8, 2020.

(58) Field of Classification Search
CPC ............ A61N 1/36146; A61N 1/36175; A61N 1/36178; A61N 1/37247; A61N 1/37252; A61N 2/002; A61N 2/006; C09D 5/14; C09D 5/1625; C09D 7/63; C08K 5/0058; C08K 5/3415

See application file for complete search history.

(56) References Cited

U.S. PATENT DOCUMENTS

| | | |
|---|---|---|
| 2011/0276107 A1 | 11/2011 | Simon |
| 2014/0288551 A1 | 9/2014 | Bharmi |
| 2018/0078761 A1 | 3/2018 | Bolea |
| 2019/0083774 A1 | 3/2019 | Harris |

OTHER PUBLICATIONS

ISA/US, United States Patent and Trademark Office (USPTO), International Search Report and Written Opinion issued Feb. 25, 2022, related PCT international application No. PCT/US2021/062243, pp. 1-16, with claims searched, pp. 17-26.

Rodgers, GM, et al., "Cancer and chemotherapy-induced anemia", J. Natl. Compr. Canc. Netw., 2012, 10(5), pp. 628-653.

Lyman, GH, et al., "Risk models for predicting chemotherapy-induced neutropenia", Oncologist, 10(6), 2005, pp. 427-437.

Weycker, D., et al., "Risk and Consequences of chemotherapy-induced thrombocytopenia in US clinical practice", BMC Cancer, 19(1), 2019, p. 151.

Boulais, PE, et al., "Making sense of hematopoietic stem cell ninches", Blood, 125(17), 2015, pp. 2621-2629.

Hanoun, M. et al., "Neural regulation of hematopoiesis, inflammation, and cancer", Neuron, 86(2), 2015, pp. 360-373.

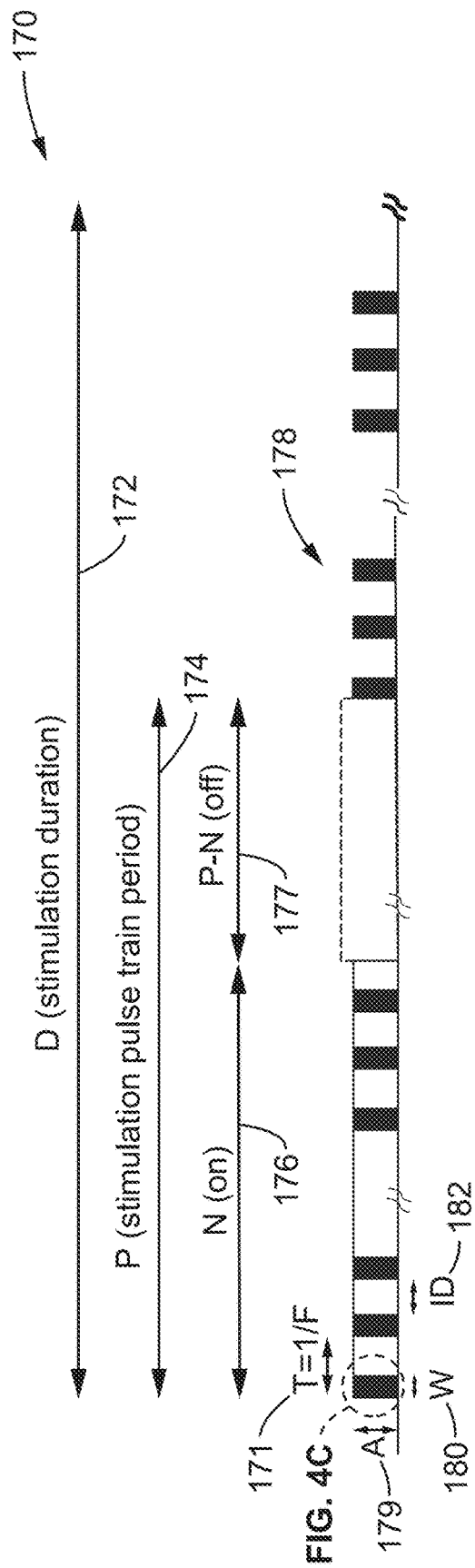

Aa (μA) - anodic stimulation amplitude
Ac (μA) – cathodic stimulation amplitude (balanced asymmetric biphasic)
Wa (μs) – anodic pulse width (monophasic or symmetric/leading asymmetric biphasic)
Wc(μs) – cathodic pulse width (trailing balanced asymmetric biphasic)
ID (μs) - Inter-pulse delay
IP (μs) - Inter-phasic delay
T (ms) - intraburst stimulation pulse period
F (Hz) = 1/T – intraburst stimulation pulse frequency
N (sec) – intraburst stimulation on
P-N (sec) – stimulation off
P (sec) – burst period of stimulation pulse train protocol
D (minutes) – total stimulation duration

FIG. 4A

1. Mono-phasic Stimulation:
1.a Cathodic Stimulation 1.b Anodic Stimulation

2. Bi-phasic Stimulation:

2.a Balanced Symmetry Bi-phasic (cathodic leading)

2.b Balanced Symmetry Bi-phasic (anodic leading)

2.c Balanced Asymmetry Bi-phasic (cathodic leading)

2.d Balanced Asymmetry Bi-phasic (anodic leading)

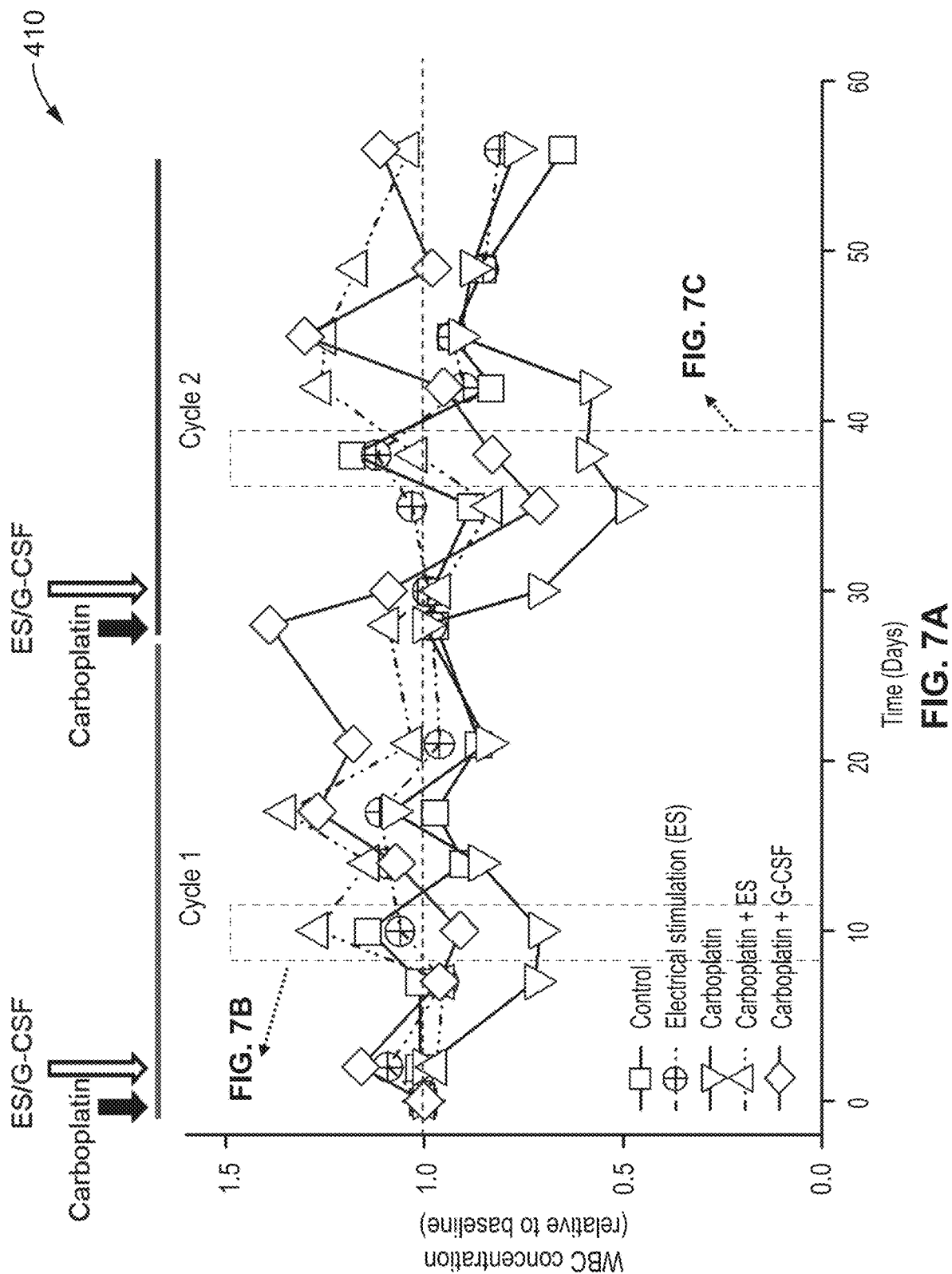

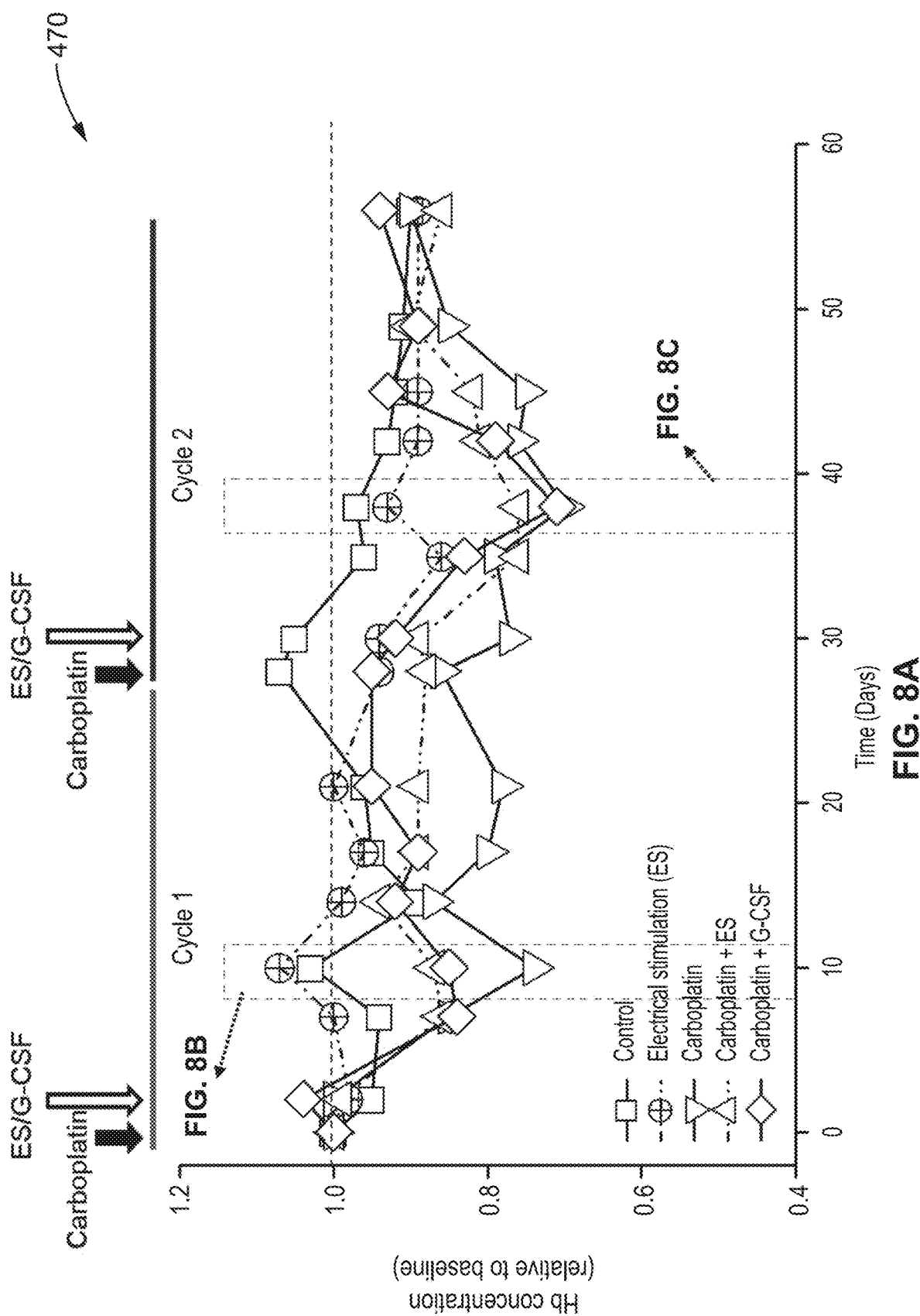

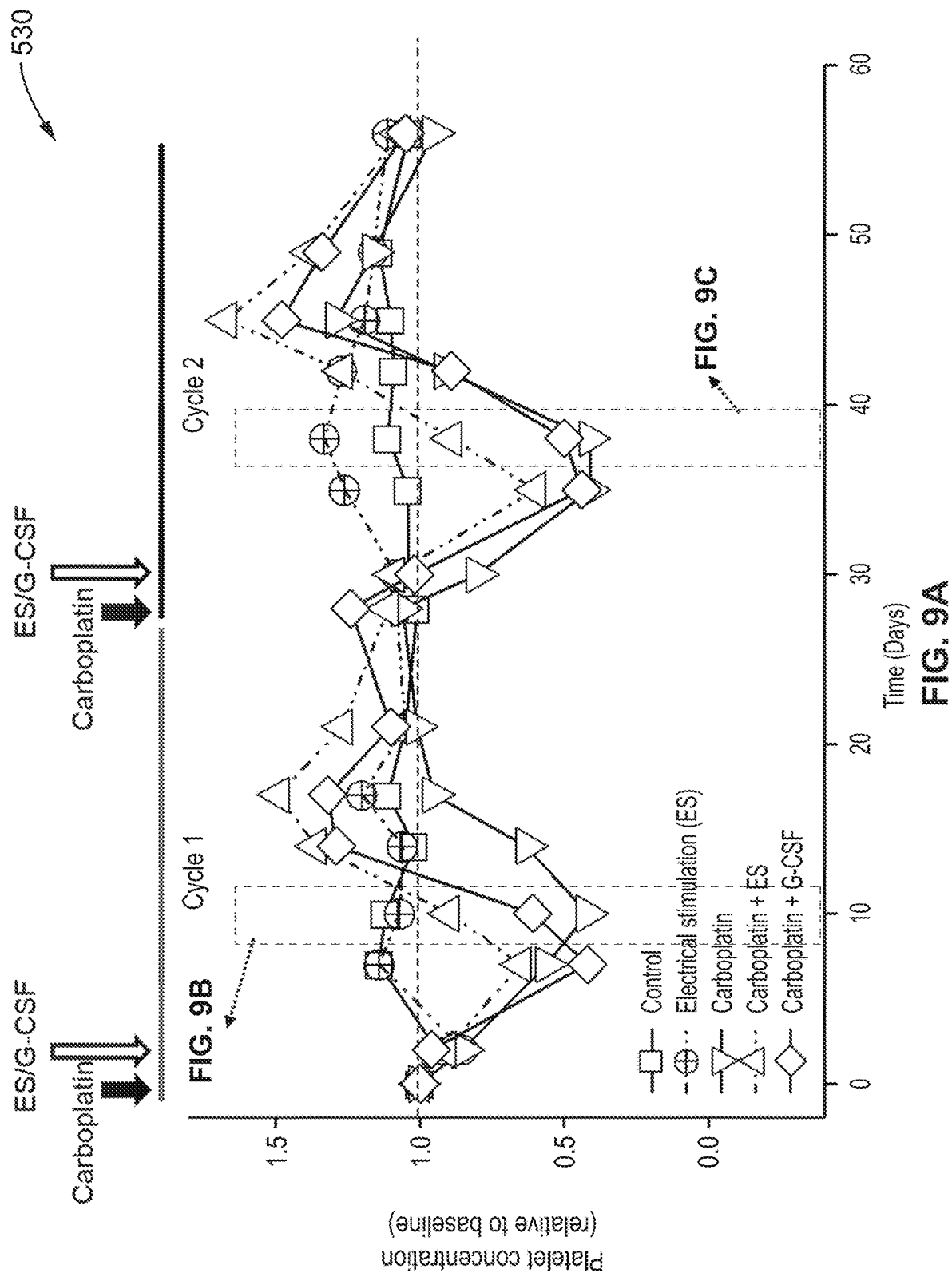

BIOELECTRIC NEUROMODULATION FOR HEMATOPOIESIS REGULATION DURING CHEMOTHERAPY

CROSS-REFERENCE TO RELATED APPLICATIONS

This application claims priority to, and is a 35 U.S.C. § 111(a) continuation of, PCT international application number PCT/US2021/062243 filed on Dec. 7, 2021, incorporated herein by reference in its entirety, which claims priority to, and the benefit of, U.S. provisional patent application Ser. No. 63/122,794 filed on Dec. 8, 2020, incorporated herein by reference in its entirety. Priority is claimed to each of the foregoing applications.

The above-referenced PCT international application was published as PCT International Publication No. WO 2022/125571 A1 on Jun. 16, 2022, which publication is incorporated herein by reference in its entirety.

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

STATEMENT REGARDING FEDERALLY SPONSORED RESEARCH OR DEVELOPMENT

Not Applicable

BACKGROUND

1. Technical Field

The technology of this disclosure pertains generally to chemotherapy therapy, and more particularly to a chemotherapy treatment option which reduces adverse impacts to Hematopoiesis.

2. Background Discussion

Chemotherapy is an important therapy for destroying cancers, however during therapy hematopoietic cells are damaged as well. Different types of treatment have been developed for chemotherapy-induced cytopenia, including erythropoietin for anemia, Granulocyte Colony Stimulating Factor (G-CSF) for neutropenia, and thrombopoietin for thrombocytopenia. However, these hematologic toxicities cannot be fully reversed by the administration of these growth factors. As the result, bleeding and infection are still the major causes of treatment-related morbidity and mortality in patients with cancers. Moreover, these adverse effects can be aggravated further over multiple chemotherapy cycles, which impedes hematopoietic stem cell (HSCs) mobilization, harvest, and engraftment after transplantation.

It should also be appreciated that not only are hematopoietic and stromal cells affected, the sympathetic nerve system (SNS) within the bone marrow microenvironment is also damaged by several chemotherapeutic agents. Injury of bone marrow SNS impairs the regeneration of HSCs and the recovery of bone marrow niche after genotoxic insult.

The SNS plays a critical role in maintaining the bone marrow niche and modulating hematopoiesis. Various types of adrenergic receptors (ARs) are involved in this phenomenon. After stimulation of $\beta2$-ARs on hematopoietic progenitor cells and $\beta3$-ARs on Nestin+-mesenchymal stem cells (MSCs), HSCs can proliferate and egress into peripheral blood. Activation of $\alpha2$-ARs promotes megakaryocyte adhesion, migration, and proplatelet formation. Sympathetic denervation of a murine hind limb using surgical transection of femoral and sciatic nerves leads to premature HSC aging, and supplementation of a sympathomimetic drug acting on ARs significantly rejuvenated in vivo function of HSCs. However, this pharmaceutical approach raises concerns about concomitant systemic adverse effects, such as hypertension, tachycardia, and atherosclerosis, inevitably limiting its clinical applicability.

Accordingly, a need exists for enhanced chemotherapy treatment options which mitigate adverse events. The present disclosure describes a treatment option which overcomes many of the adverse events, while providing additional benefits.

BRIEF SUMMARY

An apparatus and method for stimulating nerves at targeted locations, including sympathetic nerves, or spleen, or the vagus nerve and its associated branches toward mitigating negative impacts to hematopoiesis, which is the process by which the body produces blood cells (e.g., white blood cells, red blood cells, platelets). The present disclosure thus provides neuroprotection during chemotherapy that may prevent long-term bone marrow damage. The specific form and method of applying the stimulation innervates patient bone marrow to reduce chemotherapy impacts on hematopoiesis can be either direct electrical stimulation or indirect stimulation. In at least one example embodiment, the stimulation is performed by electrodes, or one or more electrode arrays, that are configured to electrically modulate nerve fibers which regulate hematopoiesis and thus can positively regulate the microenvironment of the bone marrow.

The apparatus provides a user interface to allow the treatment parameters and operation of the unit to be controlled. The user interface communicates either through a wired or wireless communication with the controller circuit, which in turn communicates either through a wired or wireless communication with the electrode driver circuit.

In at least one embodiment this user interface preferably comprises a graphical user interface (GUI) to interface with a control circuit, which in at least one embodiment contains a processor, memory and instructions (e.g., microcontroller, System On a Chip (SoC), Application Specific Integrated Circuit (ASIC), and/or other circuitry for controlling signal output and timing in response to receiving parameters from a user interface). In at least one embodiment, these parameters are based on the patient's physiological state, and are thus a personalized set of stimulation parameters. The controller circuit converts treatment parameters into a series of Building Block Waveforms (BBWs) which are output to Current/Voltage Driver Circuitry (CDC) whose outputs are coupled to one or more electrodes, or electrode arrays, or a combination thereof.

The results demonstrate that the use of the apparatus and method of the present disclosure can significantly reduce adverse impacts to hematopoiesis, and thus improve overall chemotherapy outcomes.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 4A is a waveform diagram showing parameters that specify the stimulation waveforms according to at least one embodiment of the present disclosure.

FIG. 7A is a plot of white blood cell (WBC) concentration relative to a baseline in response to different forms of management according to results obtained for at least one embodiment of the present disclosure.

FIG. 8A is a plot of hemoglobin concentration relative to a baseline for different forms of management as performed in two cycles according to at least one embodiment of the present disclosure.

FIG. 9A is a plot of platelet concentration relative to a baseline for different forms of management according to at least one embodiment of the present disclosure.

DETAILED DESCRIPTION

1. Hematopoiesis Modulation System
1.1. High Level System Description

Figure 1:
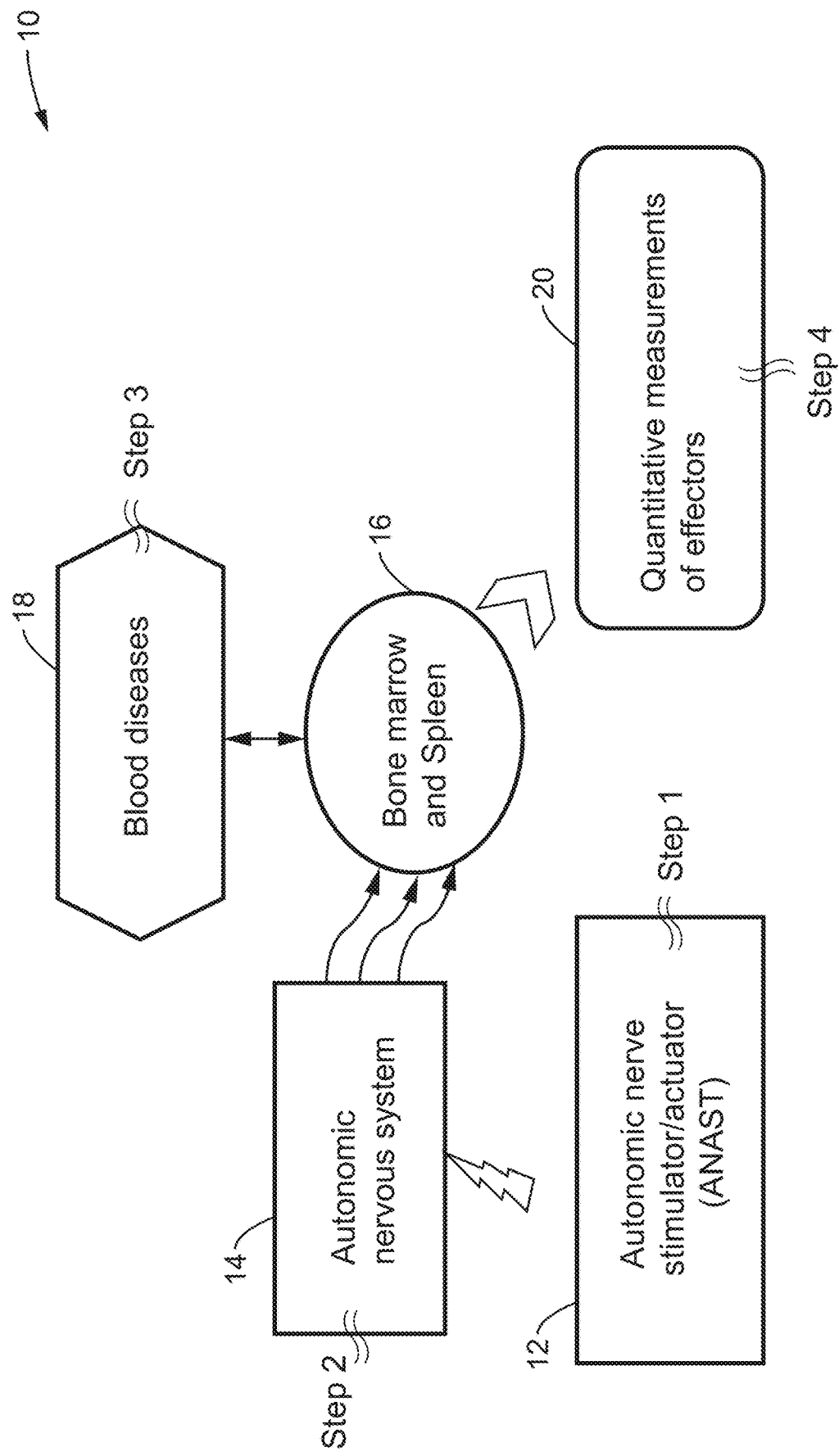
FIG. 1 is a block diagram for a method of regulating hematopoiesis according to at least one embodiment of the present disclosure.

FIG. 1 illustrates an example embodiment 10 of a system and method for regulating hematopoiesis. An Autonomic Nerve Actuator and Stimulator 12 (ANAST) which is coupled (step 1) for acting on the autonomic nervous system 14 and directed at (step 2) the bone marrow and spleen 16 when addressing (step 3) blood diseases 18, as well as for performing quantitative measurement of effectors 20 (step 4).

The method includes the steps of selecting a specific waveform shape based on a system constraint of a waveform generator, and applying a temporal pattern of stimulation to targeted nerves that innervate the bone marrow using the waveform generator, the temporal pattern of stimulation comprising a plurality of single pulse and multiple pulse groups, with constant and randomized inter-pulse intervals between the single pulses and multiple pulse groups, as well as constant or randomized inter-pulse intervals, as well as pulse widths, within the multiple pulse groups themselves.

This method and system for bone marrow innervation stimulation may include an electrode(s) to access the targeted nerves either via implantable or transcutaneous mechanism and a stimulus generator operably coupled to the electrode, where the stimulus generator applies electrical stimulation. Connected to at least one electrode, the stimulus generator (ANAST) is configured to transmit to the electrode an electrical signal for innervating (via either sympathetic or parasympathetic nervous system) the bone marrow. A waveform shape of the electrical signal is shown and described in FIGS. 4A and 4C. The electrical signal may also utilize a temporal pattern of stimulation, such as comprising a repeating succession of pulse trains, with each pulse train having a plurality of single pulse and multiple pulse groups, with constant or randomized inter-pulse intervals between the single pulses and multiple pulse groups, and also having constant or randomized inter-pulse intervals, as well as randomized pulse width, within the multiple pulse groups themselves. The pulse train repeating in succession innervates and regulates the microenvironments, which closely affect the hematopoiesis at the bone marrow.

1.2. ANAST Stimulation System Description

Figure 2:
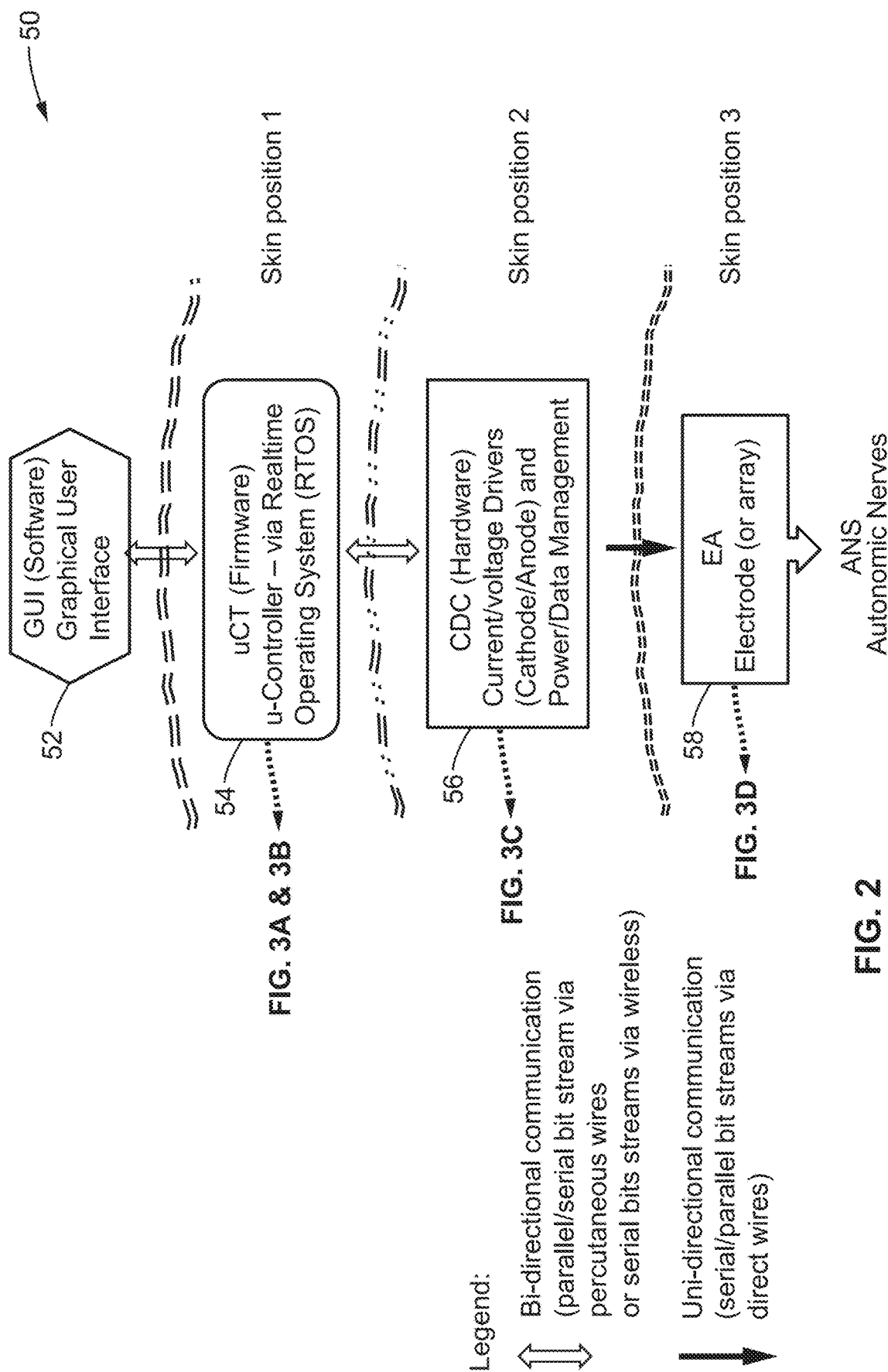
FIG. 2 is an overview of an ANAST system, consisting of four submodules: Graphical User Interface (GUI), Controller (CTL) or Firmware (microcontroller (uC)), Current/Voltage Driver Circuitry (CDC), and Electrode Array (EA); according to at least one embodiment of the present disclosure.

FIG. 2 illustrates an example embodiment 50 of the ANAST system. The ANAST system in this example comprises four submodules: a Graphical User Interface (GUI) 52, Controller (CTL) and/or Firmware (micro-controller (uC)) 54, Current/Voltage Driver Circuitry (CDC) 56, and Electrode Array (EA) 58. It should also be appreciated that the structures and functions described may be divided in other ways across submodules, which may be more or less than exemplified herein, without departing from the teachings of the present disclosure.

The coupling mechanism between any two of the submodules can be realized either via wired (serial or parallel) or wireless (serial) mode. By way of example and not limitation, a preferred connectivity of bi-directional communications is shown between the upper layers and a uni-directional communications to the lowest level being the electrode(s) or electrode array(s) themselves. The overall ANAST system can be configured for deployment in supporting the regulation of hematopoiesis through innervating the bone marrow.

The configuration of Skin Position 3, as seen at the bottom of the figure, illustrates that at least one embodiment could house together a subsystem of controller (e.g., processor and firmware), driver, and electrode (array) as an implantable unit and leave the GUI as an external unit. The configuration of Skin Position 2, as seen in the center portion of the figure, shows another embodiment which may house together an implantable unit of the driver and electrode (array), and leave a subsystem of GUI and controller (e.g., processor and firmware) as the external unit. Skin Position 1, shown at the upper portion of the figure, depicts yet another embodiment which may house together the GUI, a control circuit (e.g., processor, memory and firmware), and driver as an external unit and an implantable electrode (array). Thus, the positions of the units in relation to the skin depend on the specific embodiments and its applications.

Figure 3A:
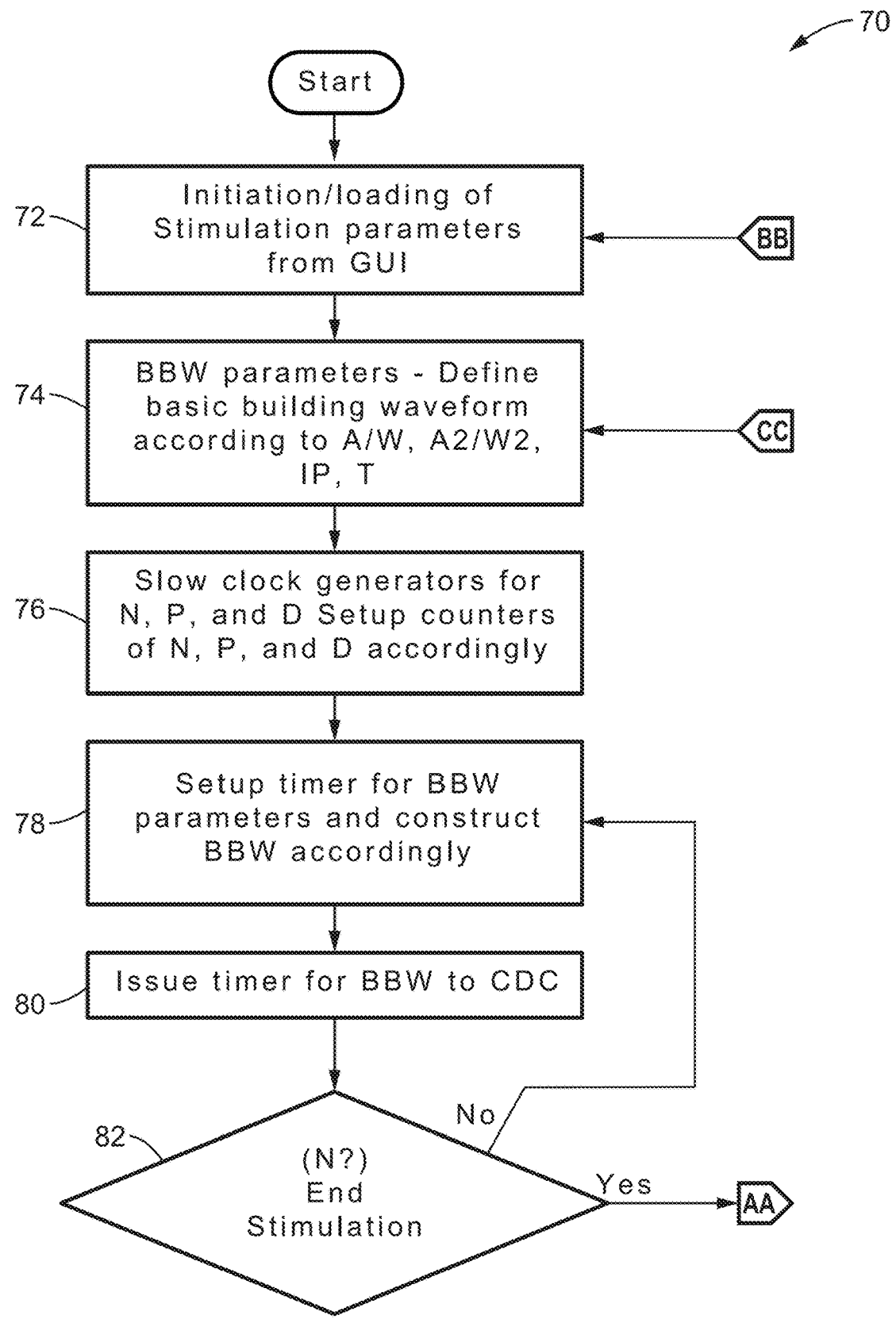
FIG. 3A and FIG. 3B is a flow diagram showing the GUI issuing a command to the controller (CTL) or firmware (uC) in order to initiate the loading of stimulation parameters from the GUI and setup of the stimulus by CDC to the targeted nerve via the electrode (EA), as shown in FIG. 2A, as performed according to at least one embodiment of the present disclosure.
Figure 3B:
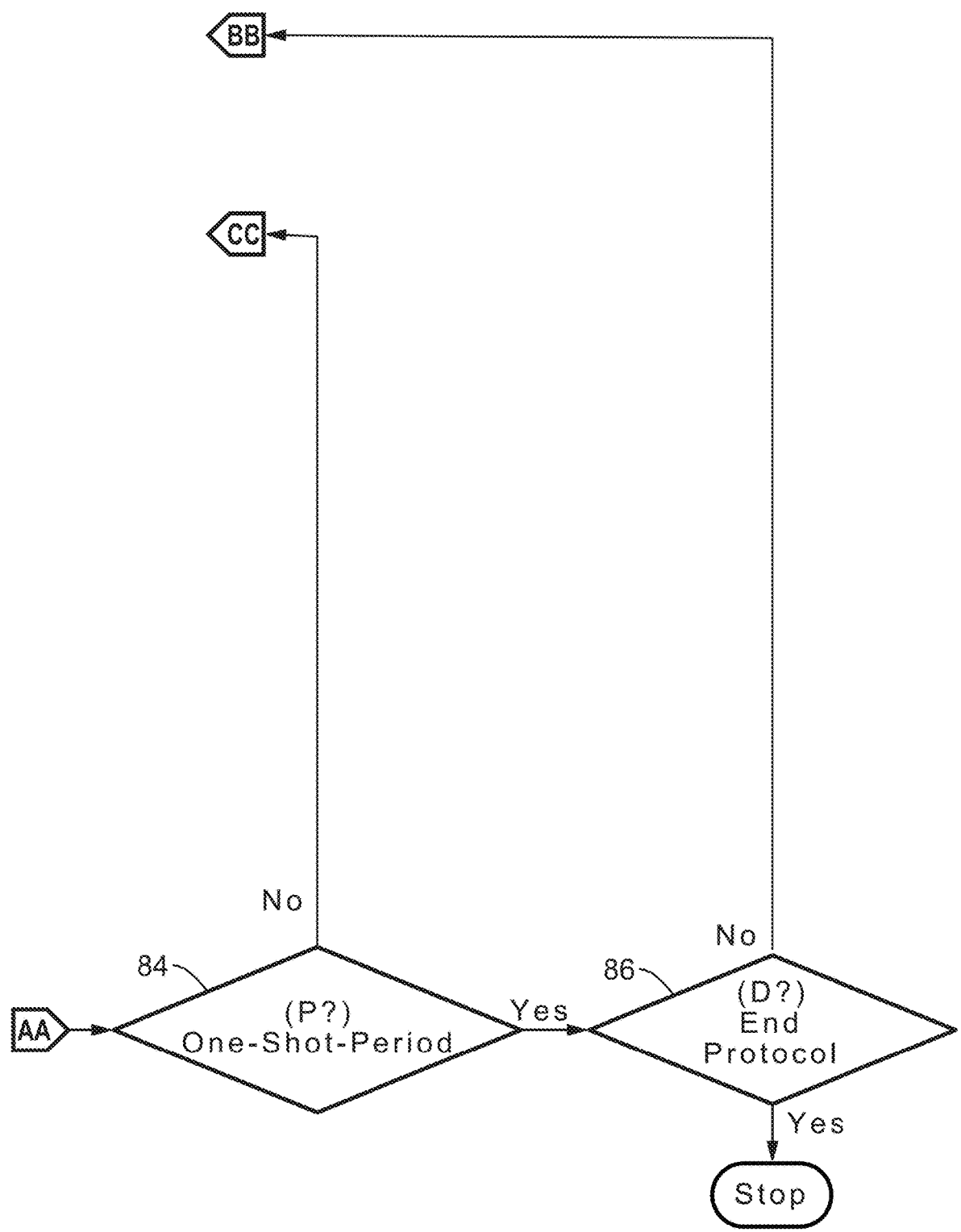

FIG. 3A and FIG. 3B illustrate an example embodiment 70 of a GUI which issues commands to the controller (CTL), such as comprising a processor (e.g., microprocessor with memory and instructions (firmware)) as shown in FIG. 2. It should also be appreciated that other circuit forms may be utilized for generating wave patterns and for controlling operations for initiating the loading of stimulation parameters from the GUI and the setup of stimulation by CDC to the targeted nerve through the electrode(s) (EA), without departing from the teachings of the present disclosure.

In the flow diagram initiation and/or loading 72 of the stimulation parameters is performed from the graphic user interface (GUI). These parameters are converted 74 into Basic Building Waveforms (BBW), described later for FIG. 4C, for example according to NW, A2/W2, IP and T. At block 76 clock generators are activated, such as slow clock generators for parameters N, P and D and setting up counters accordingly. Then at block 78 a timer is set up for the BBW parameters and constructing the BBW. Then execution reaches block 80 which issues time instructions for BBW to the CDC.

A check 82 is performed to determine if the active portion (N) of the stimulation has been completed. If it has not completed, then execution returns to block 78 with timers being setup again for BBW. Otherwise, if this N phase of stimulation has ended, then execution reaches block 84 in FIG. 3B which determines if the one-shot period (P) has ended.

If the period has ended, then execution returns to block 74 in FIG. 3A where a new period is created. Otherwise, execution reaches block 86 which determines if the entire stimulation protocol has been completed. If it has not been completed, then execution returns to block 72 in FIG. 3A where initialization/loading is performed of the parameters from the GUI; otherwise, this stimulation processing ends.

Figure 3C:
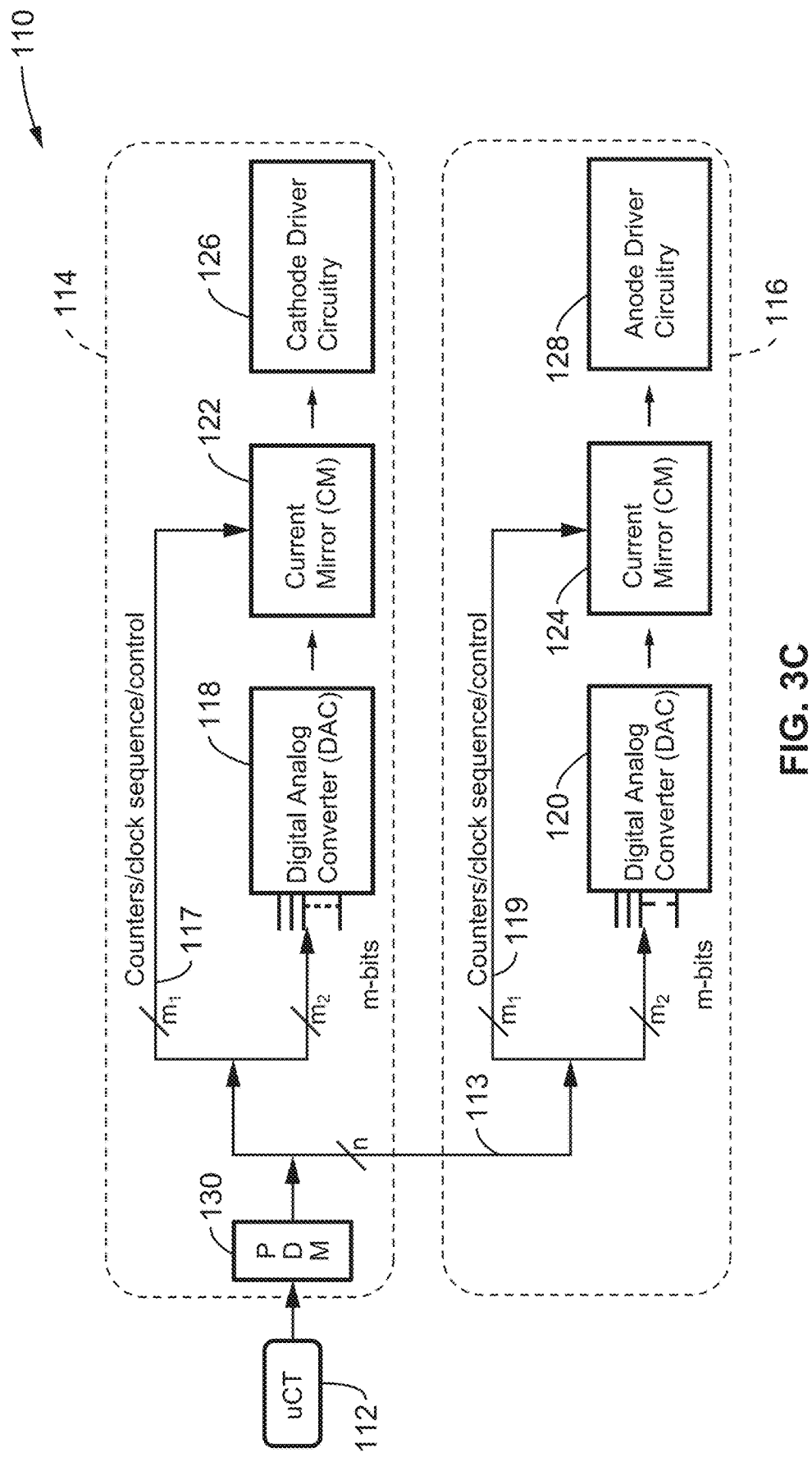
FIG. 3C is a block diagram of current driver circuitry (CDC) for supporting both anode and cathode current stimulation waveforms according to at least one embodiment of the present disclosure.

FIG. 3C illustrates an example embodiment 110 of current driver circuitry (CDC), which supports both anode and cathode current stimulation waveforms. A controller 112, such as a microcontroller (processor) with memory and firmware; or other electronic circuit(s) configured for generating sequential strings and controlling stimulation operations is coupled to drivers 114 and 116 through a power/data management (PDM) circuit 130. The controller circuit (herein exemplified as a microcontroller) activates the power/data management unit 130 which provides regulated power to the CDC circuit and associated buffer and clock conditioning/generation. The PDM circuit 130 can be configured for supporting a CDC circuit in either a wired or wireless mode.

It will be appreciated that stimulation requires current levels to be directed to the electrodes; to which the example below is directed. It should, however, be recognized that the stimulation may be regulated based on either current or voltage without departing from the teachings of the present disclosure. Current can be directed through the electrodes toward reaching a given voltage, or directed toward reaching a certain current level. One of ordinary skill in the art will appreciate the interchange between current and voltage when driving a load.

Each driver 114, 116 in this example has a similar structure for driving a stimulation signal at the electrodes. A Digital-to-Analog Converter (DAC) 118, 120, is shown receiving m-bits from the controller. Although these bits are typically sent in parallel, they can be sent as serial information and converted in or before the DAC, without departing from the teachings of the present disclosure.

It should be appreciated that data recovery in a communication sequence can be achieved utilizing either synchronous or asynchronous mode communications. By way of example and not limitation, the embodiment described below utilizes synchronous communications, however, this is not a limitation of the present disclosure which may utilize various communications approaches or protocols for communicating between the controller circuit and current driver circuit.

Following each of the DACs are current mirror circuits 122, 124. The current mirrors are generally utilized here as voltage to current amplifiers, with the proviso described in the previous paragraph. In at least one example embodiment, the current mirrors operate as current amplifiers which have two branches; a reference branch and an output branch, whereby the output current is a multiple of the reference current. The reference current branch is made of N parallel sub-branches such that the overall reference current is equal to the values specified by the N-bit binary code. Each binary bit represents a binary voltage which is converted to current in the drive circuit.

The current mirror could be turned on and off according to the controlled switch (usually connected to the mirror circuitry in serial). This switch is further controlled by the "counter/clock sequence/control) signals provided by the controller circuit (uCT).

The current mirrors output current amplitudes, $A_c$ from CM 122, and $A_a$ from CM 124, respectively to a cathode driver circuit 126 and anode driver circuit 128. The pulse width of each anode and cathode pulse is specified by parameters $W_k$. and $W_a$, respectively, the resolutions of which are limited by the clock frequency.

It will be appreciated that the generation of these cathode and anode drive waveforms may be accomplished with variations of this circuit, or alternatives, which otherwise are configured for setting signal patterns to drive both cathode and anode circuitry for the stimulation patterns. Accordingly, the present disclosure is not limited to the specific structure exemplified in this figure.

Figure 3D:
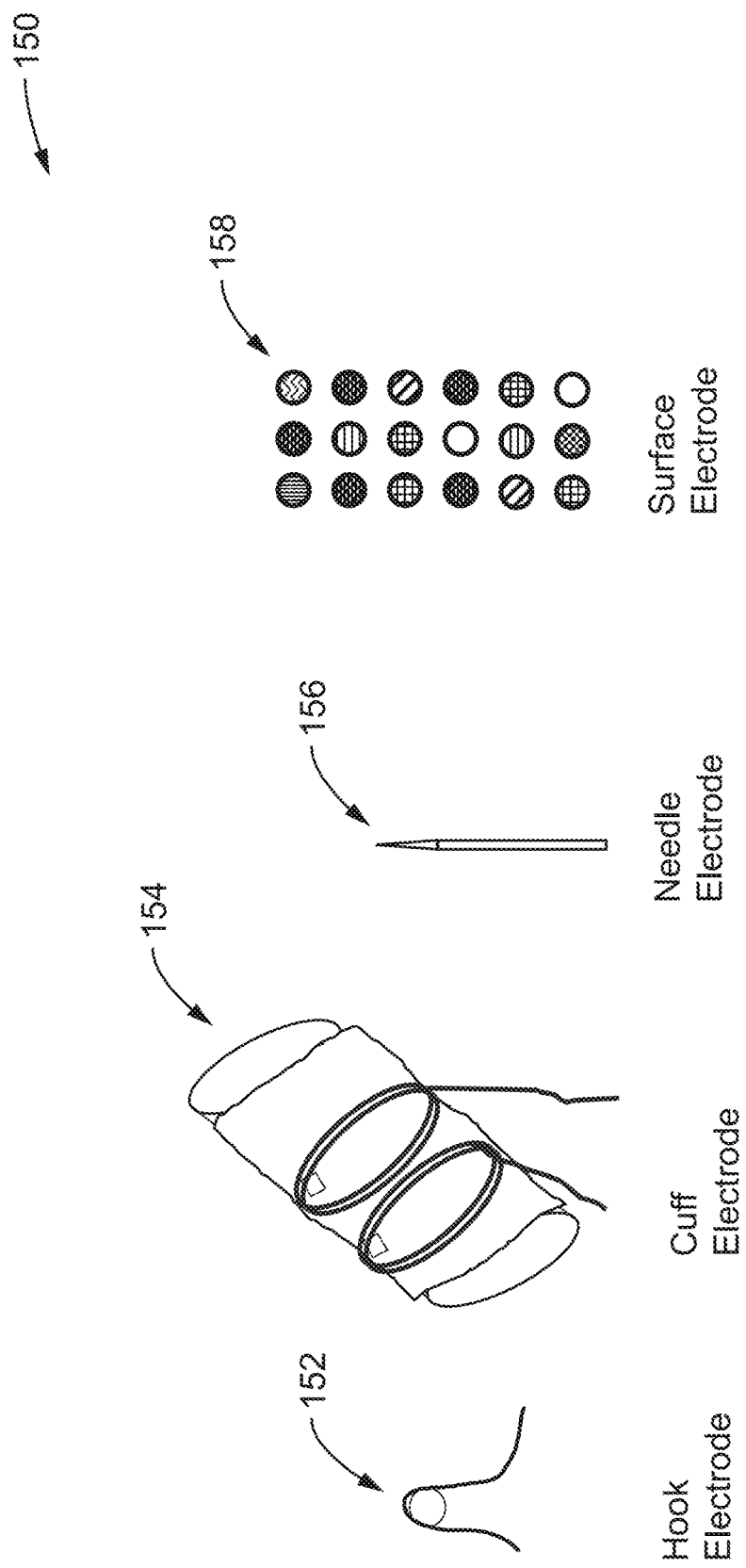
FIG. 3D is a pictorial showing various example electrode structures (e.g., hook, needle, cuff, surface, and electrode array) which may be utilized according to at least one embodiment of the present disclosure.

FIG. 3D illustrates an example embodiment 150 of various electrode structures. By way of example, and not limitation, the electrode structures in at least one embodiment can utilize one or more hook electrode 152, cuff electrode 154, needle electrode 156, and surface electrodes 158; while other electrodes known to one of ordinary skill in the art and/or combinations of various electrode types may be utilized without departing from the teachings of the present disclosure. A multiple or a plurality of any electrodes or combinations may be utilized, such as shown in electrode array 158 (comprising surface electrodes). In at least one embodiment at least one electrode array is utilized, which for example may be retained in a fixed or stretchable substrate.

FIG. 4A through FIG. 4D illustrate an example embodiment 170, 210, 250 and 290 of parameters for controlling stimulation.

In FIG. 4A is shown the timing and counters of intraburst stimulation pulse period (T) 171, total stimulation duration (D) 172, burst period of stimulation pulse train protocol (P) 174, intraburst stimulation on (N) 176, value of period that stimulation is off (P-N) 177, which is the idle latency of one-shot period (P) minus the active portion of the stimulation waveform (N), for timing stimulation as set up by the controller to produce the proper waveforms as defined by the parameter set.

The parameters that specify the stimulation waveforms include specification of polarity and mode— LP (leading cathodic or anodic), MO (voltage or current), BP (biphasic), SY (symmetric or asymmetric biphasic); amplitudes, pulse widths, and delay time—$A_a$, $W_a$, $A_c$, $W_c$, IP, ID, T, N, P, and D. One example embodiment is configured with a micro-controller (uC) and associated memory and firmware for producing the desired stimulus by generating a proper timing sequence for the current driver circuitry (CDC).

A pulse train 178 is shown having amplitude (A) 179, intraburst stimulation pulse period (T) 171, pulse width (W) 180 and inter-pulse delay (ID) 182. The rectangular black sections of the waveform represent the basic building block waveforms as shown in FIG. 4C.

Figure 4B:
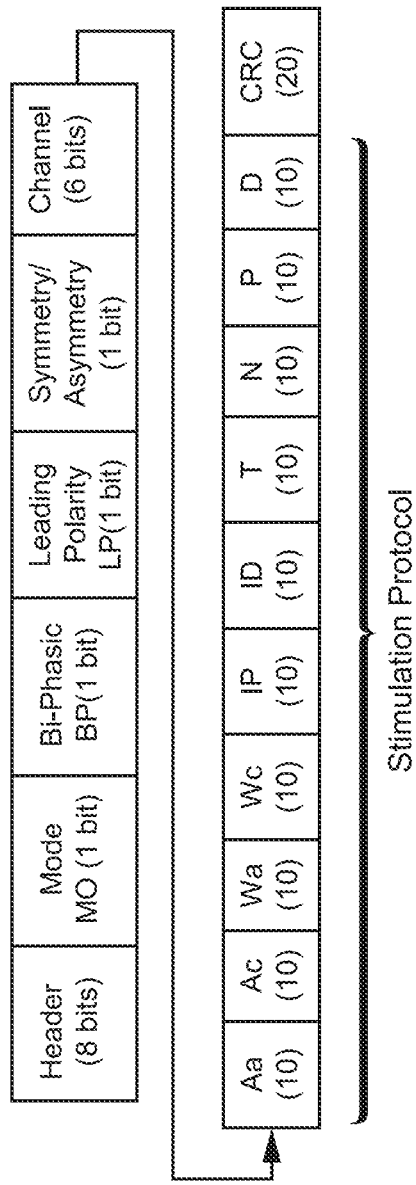
FIG. 4B is a data packet diagram for communication between the GUI and firmware of the processor as utilized according to at least one embodiment of the present disclosure.
Figure 4C:
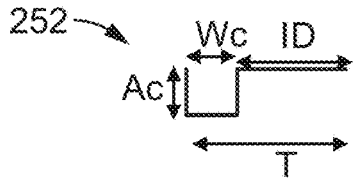
FIG. 4C are waveform diagrams showing basic timing for producing a basic building waveform (BBW) block of the pulse trains defined by N and P counters according to at least one embodiment of the present disclosure.
Figure 4C:
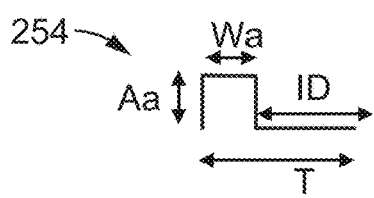
Figure 4C:
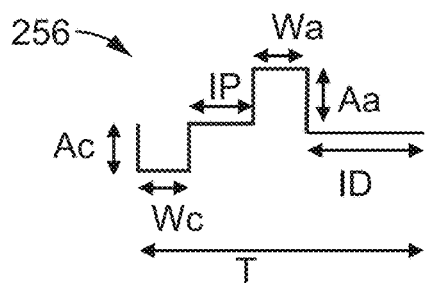
Figure 4C:
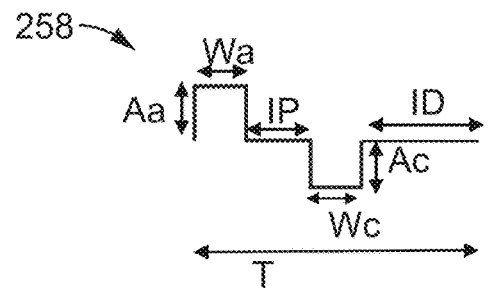
Figure 4C:
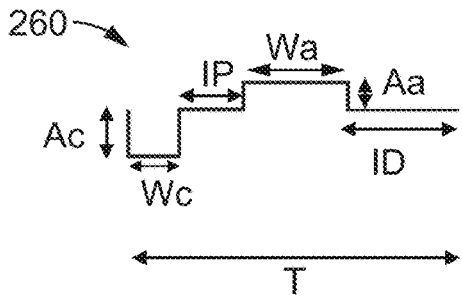
Figure 4C:
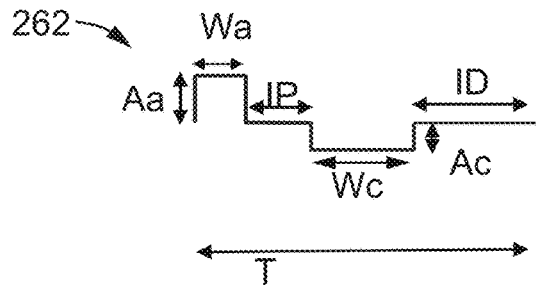

In FIG. 4B is shown a data packet 210 for an example communication protocol between the GUI and a controller and its firmware. The data packet fully specifies the stimulation parameters seen at the bottom of FIG. 4A.

The figure also exemplifies a set of counter specifications and its corresponding feasible ranges for the stimulation parameters. The device architecture is able to provide a wide range of parameters for each individual patient subject.

Using the protocol outlined in this FIG. 4B, the GUI issues a command to the controller (CTL) in order to initiate the loading of stimulation parameters from the GUI and setup of the stimulus by CDC to the targeted nerve through the electrode or electrode array (EA).

In at least one embodiment a controller circuit (CTL) is exemplified as firmware executing instructions on a micro-controller (uC) to produce the desired stimulus by generating the proper timing sequence for the CDC accordingly. The timing and counters of T, N, P, and D for controlling the stimulation parameters are set up and controlled by the uC to produce the proper waveforms defined by the parameter set. The timing is set to produce the basic building waveform (BBW) block of the pulse trains defined by N and P counters. Moreover, it is allowed to change the basic building waveform block of the pulse trains every P periods.

It should be appreciated that the resolution of the parameters in the time domain is limited by the period of the system clock; whereby increasing the frequency of the system clock allows increasing the resolution of the parameters. The counters of T, N, P, and D are updated according to the u-controller clock or corresponding slow clocks derived by uC. As an example, the resolution of 0.1 µs is achieved for a uC clock at 10 MHz. The clock generators of the uCT are programmed to produce slow clocks for the counters.

In FIG. 4C are shown examples 252, 254, 256, 258, 260 and 262 of basic timing which can be utilized according to the disclosure for building basic waveform (BBW) blocks of the pulse trains defined by N and P counters.

The first group are configured for generating mono-phasic stimulation as either cathodic stimulation 252, or anodic stimulation 254. In a second group are seen simple bi-phasic stimulation pulses, exemplifying both balanced symmetry (cathodic 256 or anodic 258 leading), and balanced asymmetry (cathodic 260 or anodic 262 leading).

The basic building waveforms (BBW) in FIG. 4C can be realized by various control circuits, for example a micro-controller containing firmware, or by hardware such as System-on-Chip (SoC), or Application-Specific Integrated Circuit (ASIC), or utilizing other forms of sequencing circuitry or combinations thereof. A pulse train (PT) is composed of a series of N (Counter N) basic building waveforms (BBWs). The One-Shot-Protocol (OSP) is in turn composed of a PT and followed by an idle latency of P-N(Counter P). The One-Shot-Protocol (OSP) is repeatedly generated until the counter D has expired.

Moreover, the controller circuit is allowed to change the basic building waveform block of the pulse trains every P period. It will be noted that the resolution of the parameters in the time domain is limited by the system clock frequency. The counters of T, N, P, and D, are updated according to the controller circuit clock or corresponding slow clocks derived by the controller circuit (e.g., processor, microcontroller, SoC, ASIC, and/or other circuitry configured for pulse generation).

Each electrode can be programmed as cathode or anode polarity in a bipolar configuration mode or as cathode or anode in monopolar mode. Furthermore, it is feasible to further support symmetric and asymmetric bi-phasic waveforms with interphasic delay (IP) in either bipolar and/or monopolar configurations.

Figure 4D:
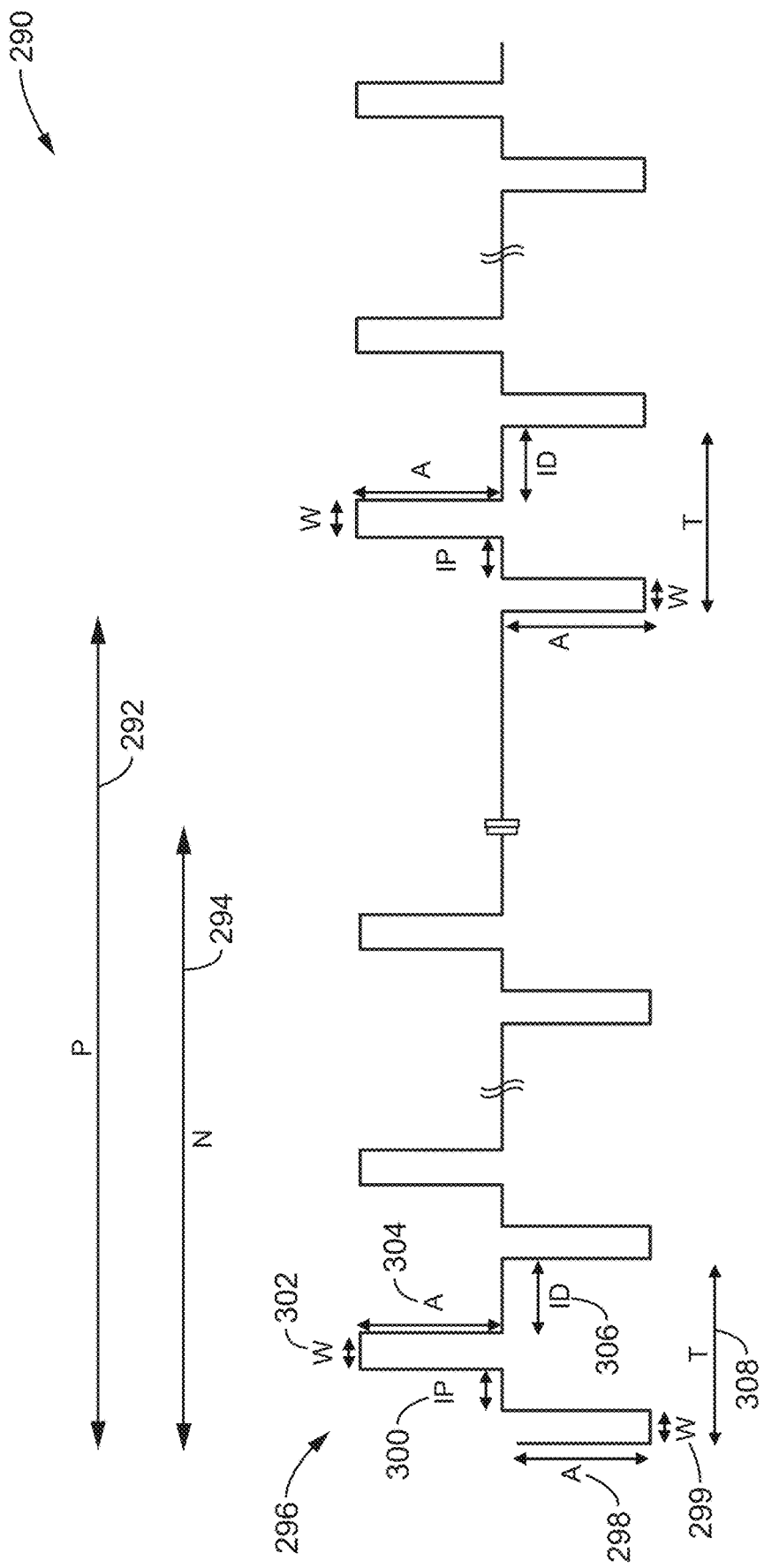
FIG. 4D is a waveform example of a high-resolution controller clock according to at least one embodiment of the present disclosure.

In FIG. 4D is seen an example 290 of a stimulation waveform, exemplifying a one-shot protocol (cathodic leading). By way of illustrative example, and not limitation, a resolution of 0.1 μs of waveform 296 is achieved for an exemplified microcontroller clock at 10 MHz. This figure demonstrates implementation of the stimulation protocol of a balanced symmetric bi-phasic waveform (P) 292 with 2 seconds on (N) 294, 8 seconds off (P-N), and then 60 minutes (D) with BBW at 20 Hz (F=1/T) of balanced symmetric biphasic waveforms with the pulse width of 0.2 ms (W), pulse amplitude of 0.5 mA (A) 298 and 304, a 0.1 ms (IP) 300, cathodic width 299 (We), anodic width 302 ($W_a$), and T 308 exemplified as being 50 ms. This waveform can be realized using 1 μs resolution of the clock for W, IP; a clock of 1 ms for T; a slow clock at 1 μs for N, P; and a slow clock at 1 minute for D.

The electrical signal may also be composed of a temporal pattern of stimulation comprising a repeating succession of pulse trains (e.g., the right side of FIG. 4D showing a second pulse train) each pulse train comprising a plurality of single pulse and multiple pulse groups, with constant or randomized inter-pulse intervals between the single pulses and multiple pulse groups, as well as constant or randomized inter-pulse intervals within the multiple pulse groups themselves, the pulse train repeating in succession to innervate and regulate the microenvironments, which closely affect the hematopoiesis at the bone marrow.

Each electrode can be programmed as cathode or anode polarity in bipolar configuration or as cathode or anode in monopolar mode. Furthermore, it is feasible to further support symmetric and asymmetric biphasic waveform with interphasic delay (IP) in either bipolar and/or monopolar configurations.

The current driver circuitry (CDC) seen in FIG. 3C supports both anode and cathode current stimulation waveforms as shown in FIG. 4C. By way of example and not limitation, each driver is composed of a Digital-to-Analog Converter (DAC) and a current mirror (CM) such that the output current amplitude, $A_a$ or $A_c$, is induced, respectively. The pulse width of each anode and cathode pulse is specified by $W_a$ and $W_c$, respectively, whose resolution is limited by the clock frequency.

The ranges for utilizing the ANAST system to augment a chemotherapy treatment are generally according to the following parameters and ranges:
 (a) Frequency: about 2 Hz to about 100 Hz.
 (b) Waveform inter-phasic delay: about 0 to about 1 ms.
 (c) Duration of each phasic pulse: about 0.05 ms to about 3 ms.
 (d) Pulse train: stimulation on (about 1 to about 5 seconds) at about 2 Hz to about 100 Hz and stimulation off (about 1 to about 10 seconds). For example, about 1 second on at about 50 Hz and about 9 seconds off.
 (f) Amplitude: about 0.05 mA to about 200 mA.
 (g) Simulation duration: about 1 minute to about 90 minutes with a repeating pattern defined by "Pulse train". For example, about 1 second on at about 20 Hz and about 9 seconds off for 60 minutes (total pulses: 20 pulses×secs/min×60 mins/10 secs=20×360 pulses=7, 200 pulses for 60 minutes).
 (h) Natural Biomimetic waveforms which mimic biological signals that represent the firing sequences and oscillation patterns by a neuron or a cluster system of neurons. Examples include EMG, EEG, sympathetic tones, parasympathetic tones, and similar neural activity.
 (i) Synthetic Biomimetic waveforms with randomized interphasic delay, pulse width, and amplitude at either a Poisson or Gaussian distribution.

1.3. Promoting Hematopoiesis by Electrical Stimulation

Electrical Stimulation (ES) targets the sympathetic nerve innervating bone marrow toward priming its microenvironments after chemotherapy. The results from testing performed in the present disclosure have demonstrated that electrical stimulation of sciatic nerve rescues bone marrow microenvironment from chemotherapy-induced injury, consequently reducing hematologic toxicity and thus mortality.

The therapeutic stimulation provided according to the present disclosure can access (stimulate) the nerves either by an invasive or non-invasive stimulation. Invasive delivery involves the use of direct electrical stimulation to an electrode/electrode array. In non-invasive stimulation the electrical stimulation is created through an indirect mechanism. In at least one embodiment, a form of ultrasound neuromodulation may be utilized in which the ultrasonic particle motions at the nerve are converted into a stimulation force (e.g., electrical stimulation). For example, as these tissues are conductive, particle motion created by an ultrasonic wave induces an electric current density generated by Lorentz forces. This can be enhanced in some cases with magnetic fields generated to pass through the nerve tissue to accentuate the stimulus.

The electrical stimulation described herein is equally applicable to both direct and indirect stimulation of the nerves. By way of example the electrodes/electrode array seen in FIG. 3D can be replaced with indirect operating electrodes, such as in the form of ultrasonic emitters with the cathode and anode drivers in FIG. 3C incorporating an ultrasonic oscillator, or otherwise receiving an ultrasonic oscillation signal.

It should also be appreciated that testing was performed at the sciatic nerve in the test results for the sake of simplicity of illustration, as the sciatic nerve notch is readily accessible for stimulation. However, it will be recognized that the described stimulation would have similar effect on other locations in the nervous system, as the nerve fibers have similar structures and neural activation potentials.

It should be appreciated that bone marrow is innervated by both sympathetic nervous system that is emerged from thoracolum bar spinal cord section and parasympathetic nervous system emerging from cranial nerves and sacral spinal cord section. Thus stimulation, at locations or regions of nerve fibers along both nervous systems mentioned above, will eventually reach the bone marrow and is able to regulate hematopoiesis.

Figure 5A:
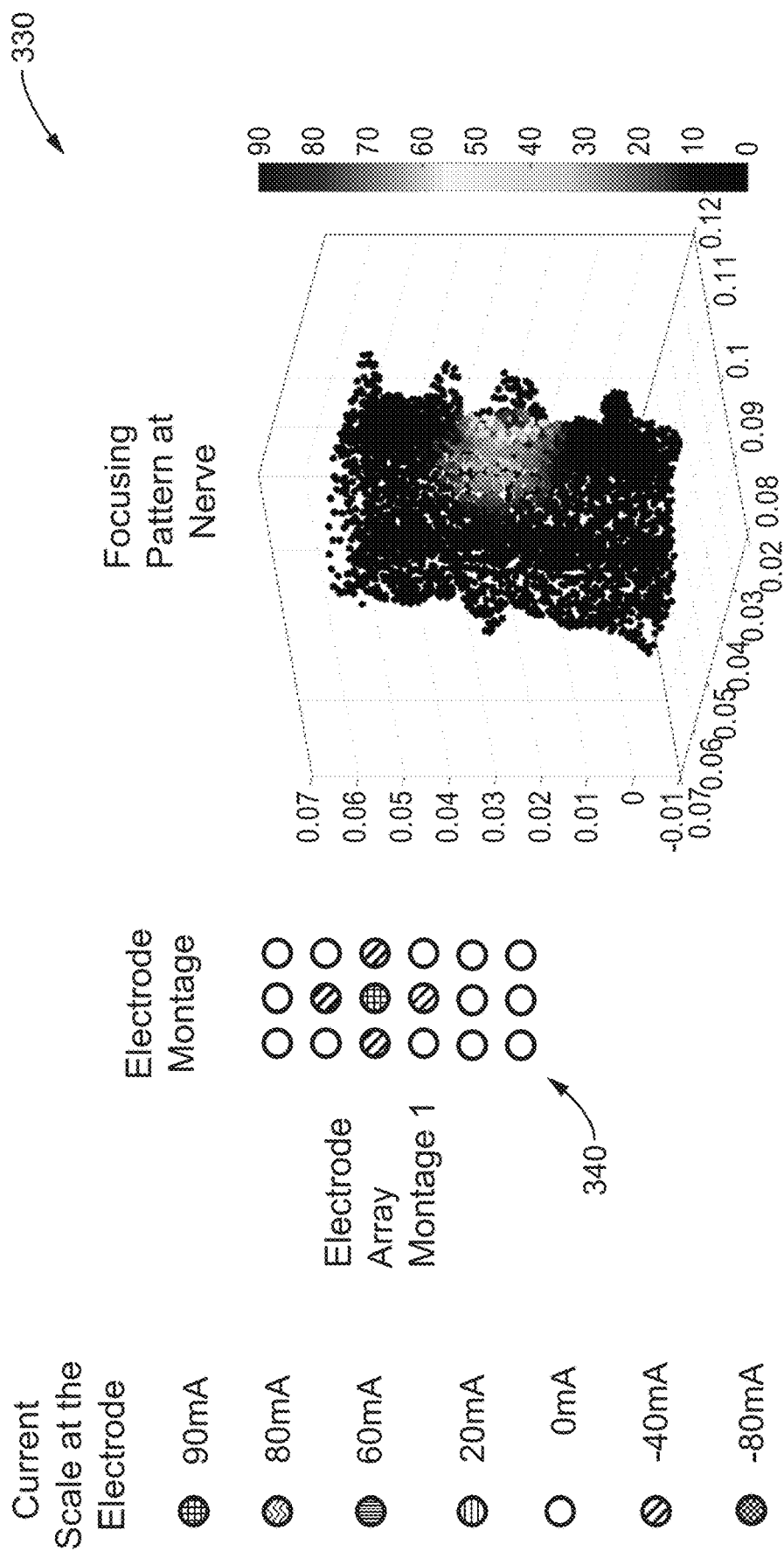
FIG. 5A through FIG. 5C are 3D graphs of focusing pattern and associated electrode montage toward achieving the focused stimulation at a specific nerve target using an electrode array (3×6) as utilized according to at least one embodiment of the present disclosure.
Figure 5B:
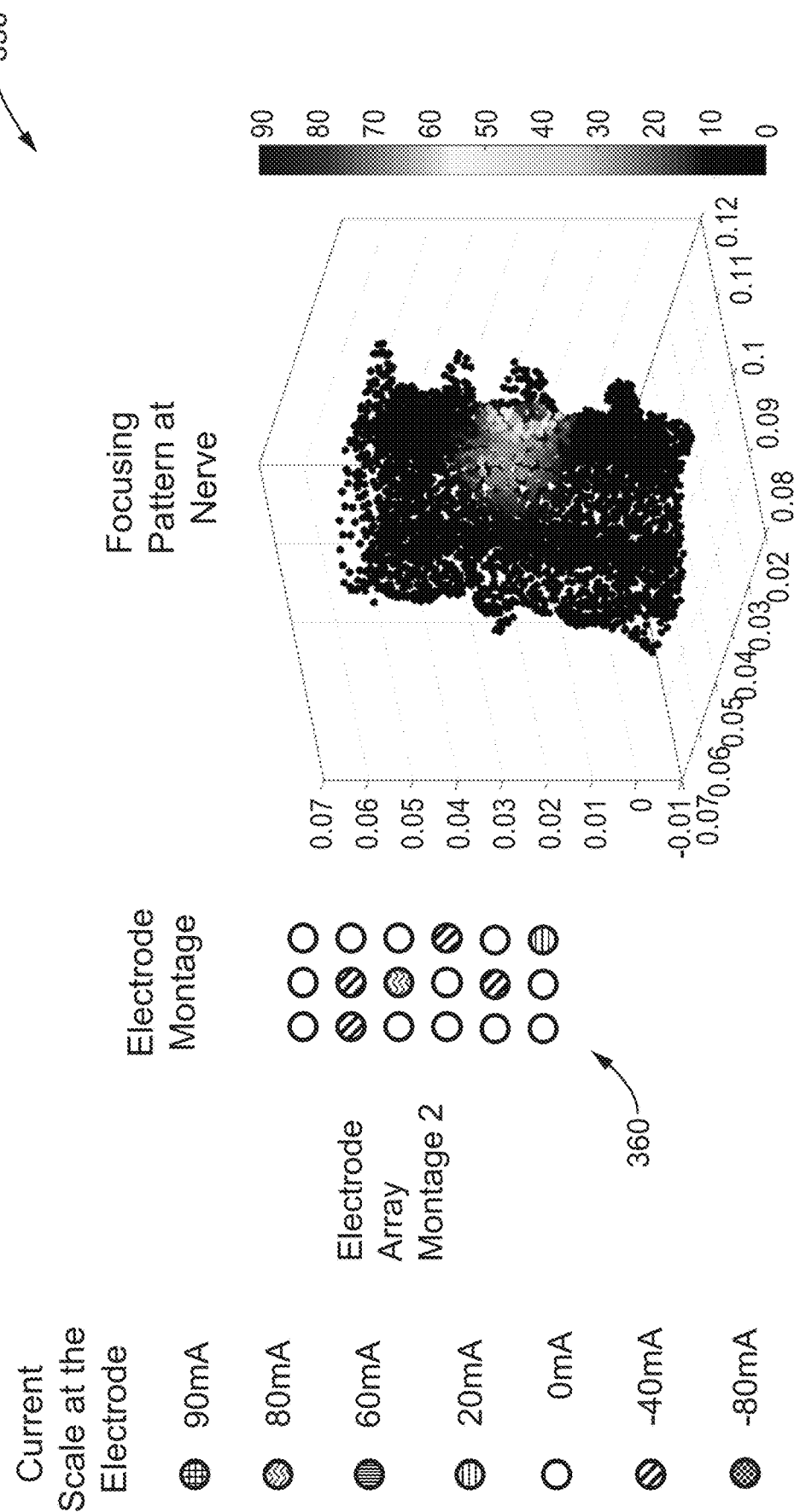
Figure 5C:
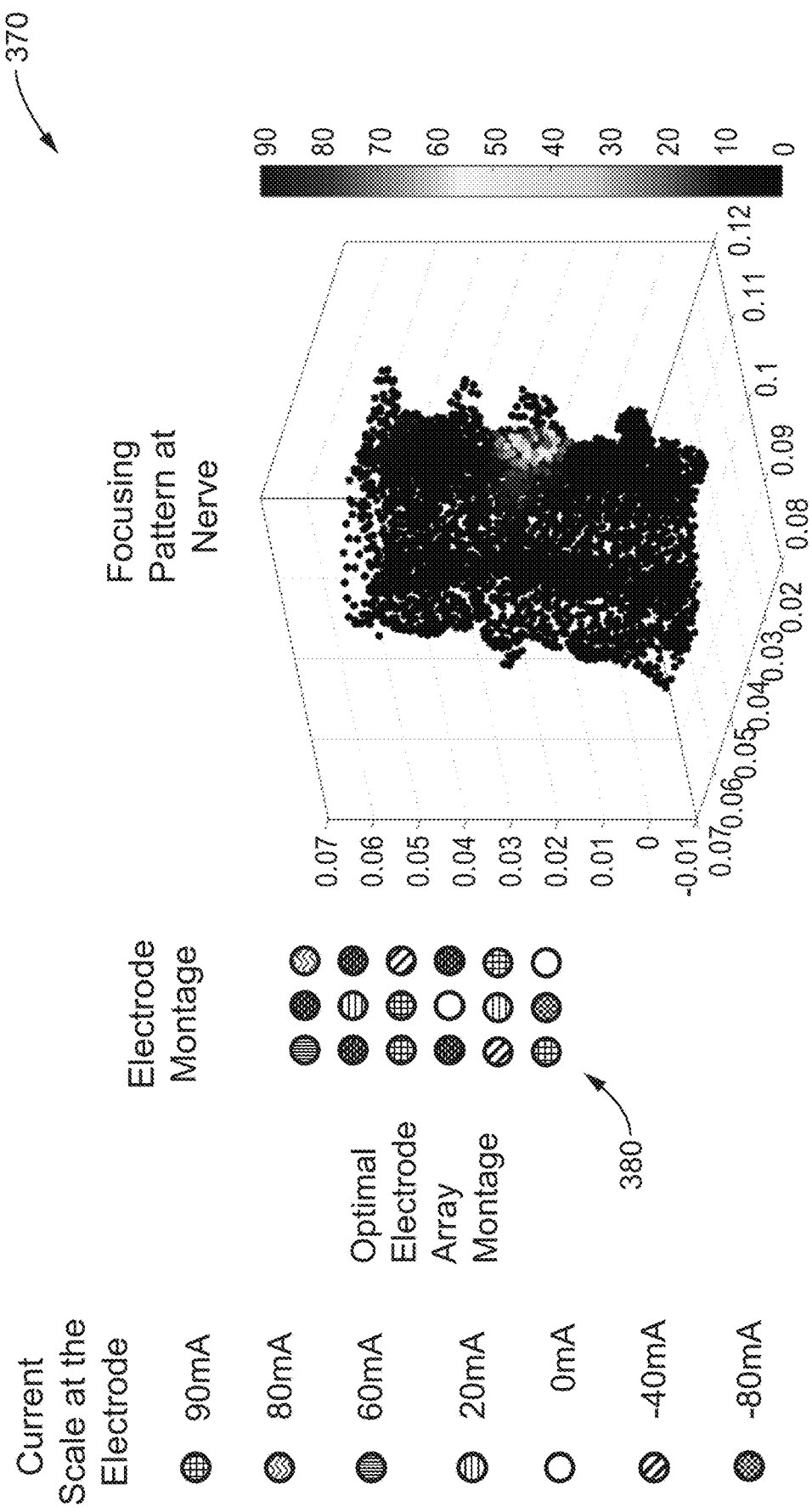

FIG. 5A through FIG. 5C illustrates an example embodiment 330, 350 and 370 of electrode array montages 340, 360 and 380 for achieving a focused stimulation at a specific nerve target, such as a 3×6 electrode array, given by example and not limitation as arrays of various x and y dimensions may be utilized in the present disclosure without limitation.

In these figures, the electrode array montage may comprise either one operating directly or indirectly; for example, the direct stimulation of electrical stimulation through each electrode of the array, or generating an indirect stimulation signal (e.g., ultrasound) which is converted at the nerve it is focused upon into a stimulation. In either case, the desired nerve fiber region can be targeted by (direct or indirect) electrical stimulation if a proper current montage from the array is utilized. Accordingly, the use of focused ultrasound (US) can reach the desired depth of nerve fibers at a pre-defined focality by properly selecting parameters, such as intensity, frequency, acoustic pressure, burst cycle, pulse rate, and duty cycle, and other US related parameters when activating sympathetic nerves.

Each figure depicts a current scale (e.g., from −80 mA up through +90 mA) on the left for interpreting the electrode states in the montage, with the right of each figure depicting a 3D focusing pattern with a scale in meters at the tissue (nerve embedded). By way of example and not limitation, each electrode (or transducer) in the array may be approximately 1 cm diameter with a 3 cm pitch. These features may be scaled down by an order of magnitude, such as in a larger array, or scaled up by a factor of up to four, with relative pitch being determined by the specific implementation and application.

In FIG. 5A and FIG. 5B is seen a first and second electrode array montage, while FIG. 5C depicts an optimal array montage. In at least one embodiment, "optimal" is defined in this context in the sense of electrical field intensity ($mA/V^2$) and the focality measurement (cm) of the electrical field at the desired stimulation target.

Figure 6:
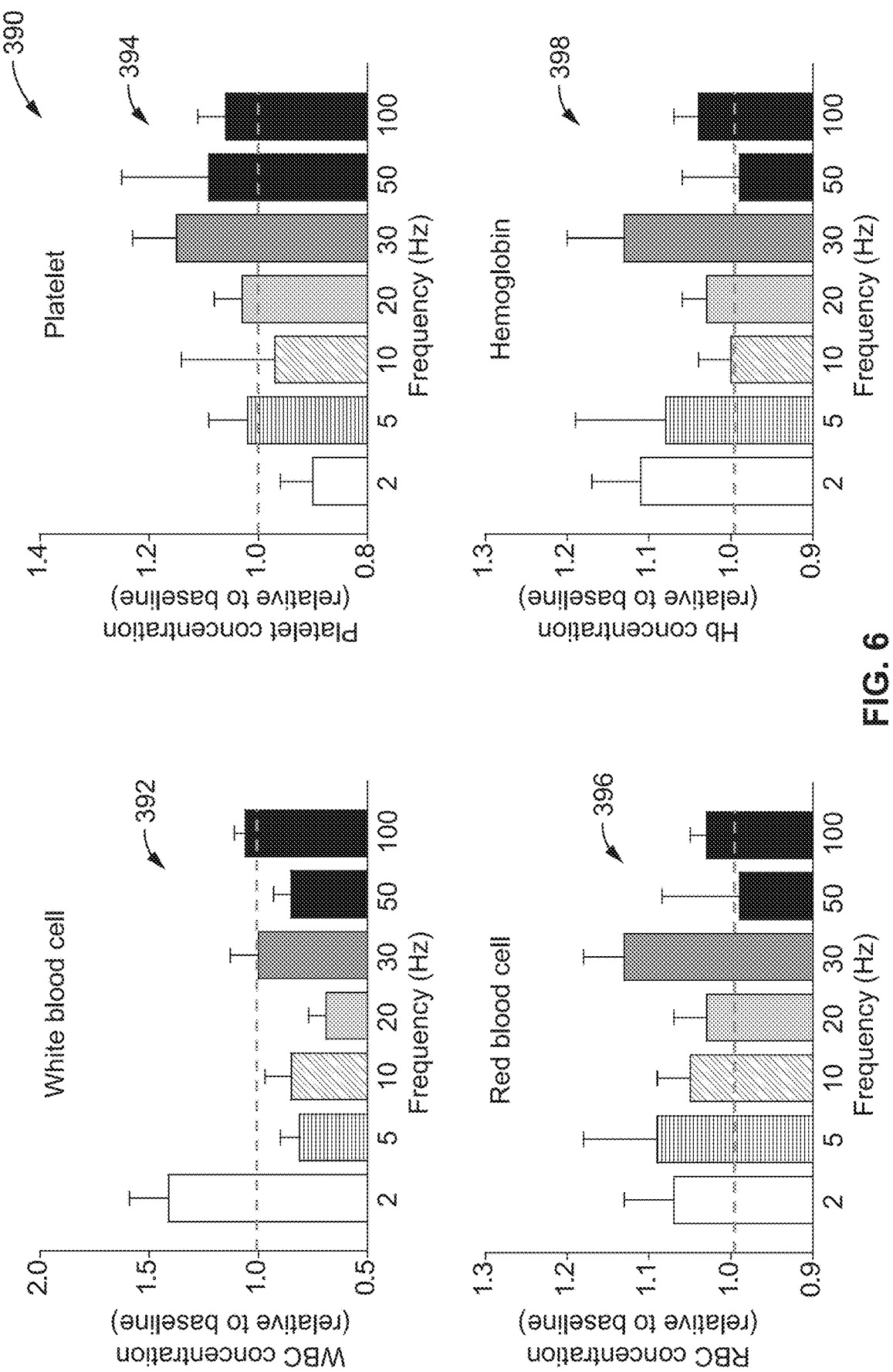
FIG. 6 are bar graphs showing that different frequencies of electrical stimulation have distinct impact on modulating the concentration of different types of blood cells within peripheral blood as a consequence of hematopoietic cells mobilizing from bone marrow to peripheral blood, as found according to results obtained for at least one embodiment of the present disclosure.

1.4. Electrical Stimulation of Autonomic Nerve Accelerates Recovery from Neutropenia and Thrombocytopenia Induced by Chemotherapy FIG. 6 illustrates an example embodiment 390 of electrical stimulation of the autonomic nerve for modulating peripheral blood cells. The electrical stimulation was performed using different frequencies applied to the nerve (e.g., sciatic nerve in this example test) of SD (Sprague-Dawley) rats for a period of time (e.g., 60 minutes), and then blood samples were obtained for performing a complete blood count. The figure illustrates that different frequencies of electrical stimulation have distinct impact on modulating the concentration of different types of blood cells within peripheral blood, which is the consequence of hematopoietic cells mobilizing from bone marrow to peripheral blood.

In the present disclosure other ranges have been tested for the rat experiments, including the use of pulse widths in the range from 0.05 to 3 mS and current amplitudes from 0.25 to 3 mA. For human subjects the current amplitude range is set from 0.05 to 200 mA.

The figure depicts bar charts for white blood cell concentration 392, platelet concentration 394, red blood cell concentration 396 and hemoglobin concentration 398, at frequencies from 2 Hz to 100 Hz. It can be seen from these charts that these concentration levels can be significantly altered depending on the frequency of stimulation utilized. Thus, the parameters can be modulated, such as frequency in this case, by ANAST toward optimizing the tradeoffs between different physiological characteristics, such as concentration of white blood cells, red blood cells and hemoglobin.

2. Hematologic Adverse Events

The use of electrical stimulation according to the present disclosure is applicable to a wide range of chemotherapeutic agents. For the sake of simplicity of illustration, the testing performed is primarily directed to one such agent, "carboplatin", however, the method and apparatus of the present disclosure is not limited to this one chemotherapy agent.

Chemotherapy-induced hematological toxicity includes damage of hematopoietic stem cells and nerve injury within bone marrow microenvironment. Some chemotherapy agents result in nerve damage such as platinum drugs, taxanes, *vinca* alkaloids, proteasome inhibitors, and alkylating agent, which in turn disrupts the hematopoiesis by deteriorating the innervation of bone marrow via adrenergic, cholinergic, and peptide receptors. Involving with cytokines and chemokines, the disrupted cascade pathways of molecular signaling prevent the normal function of both endosteal and vascular niches, a critical organism for hematopoiesis—differentiation, proliferation, and migration of Hematopoiesis Stem Cells (HSC). Specifically, damage at both endosteal and vascular niches in bone marrow exacerbates the innervation mechanism via neuroreceptors of Beta-2, Beta-3, Apha-1, Alpha-2. Sympathetic nerve mainly innervates bone marrow by regulating these receptors and trickling down the regulation of molecular pathway signaling, critically the adhesion molecular—CXCL12 (cytokine), and CXCR4 (chemokine). ES applied at the sympathetic nerve has been shown in the present disclosure to provide a high degree of success in preserving the nerve and activating the neuroreceptors and down regulating the critical cytokines and chemokines. Accordingly, the present apparatus and method significantly facilitates hematopoiesis.

As a reference, G-CSF (GranuloCyte Stimulation Factor—a cytokine) has been commonly applied after treatment of various chemotherapy agents. G-CSF activates its own molecular signaling pathways, such as down regulation of CXCL12 in order to facilitate hematopoiesis—differentiation, proliferation, and migration. It should be appreciated that the studies in this present disclosure show that the application of ES outperforms the use of G-CSF in chemotherapy treatments.

Figure 7B:
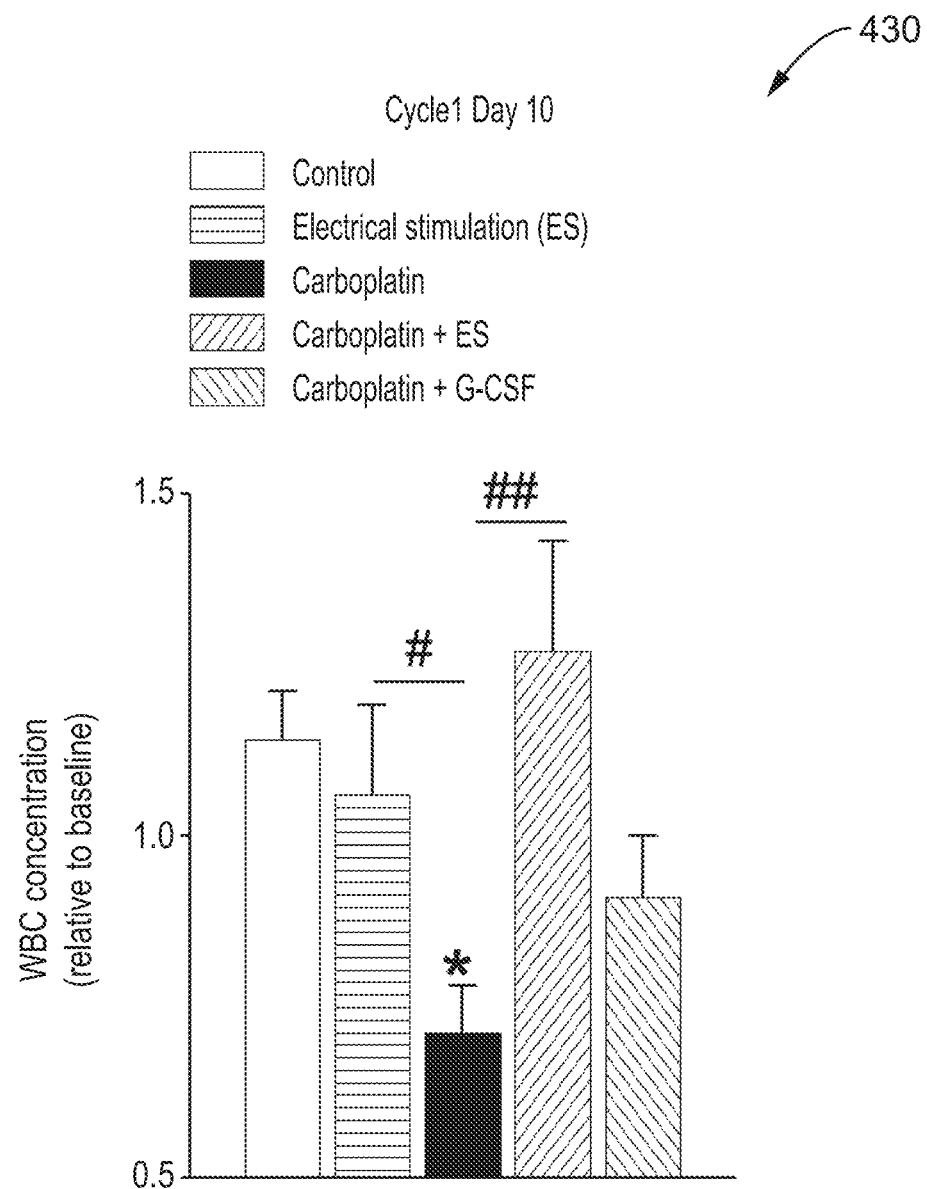
FIG. 7B and FIG. 7C are bar graphs of treatment results for electrical stimulation (ES) and administered G-CSF shown at day 10, according to results obtained for at least one embodiment of the present disclosure.
Figure 7C:
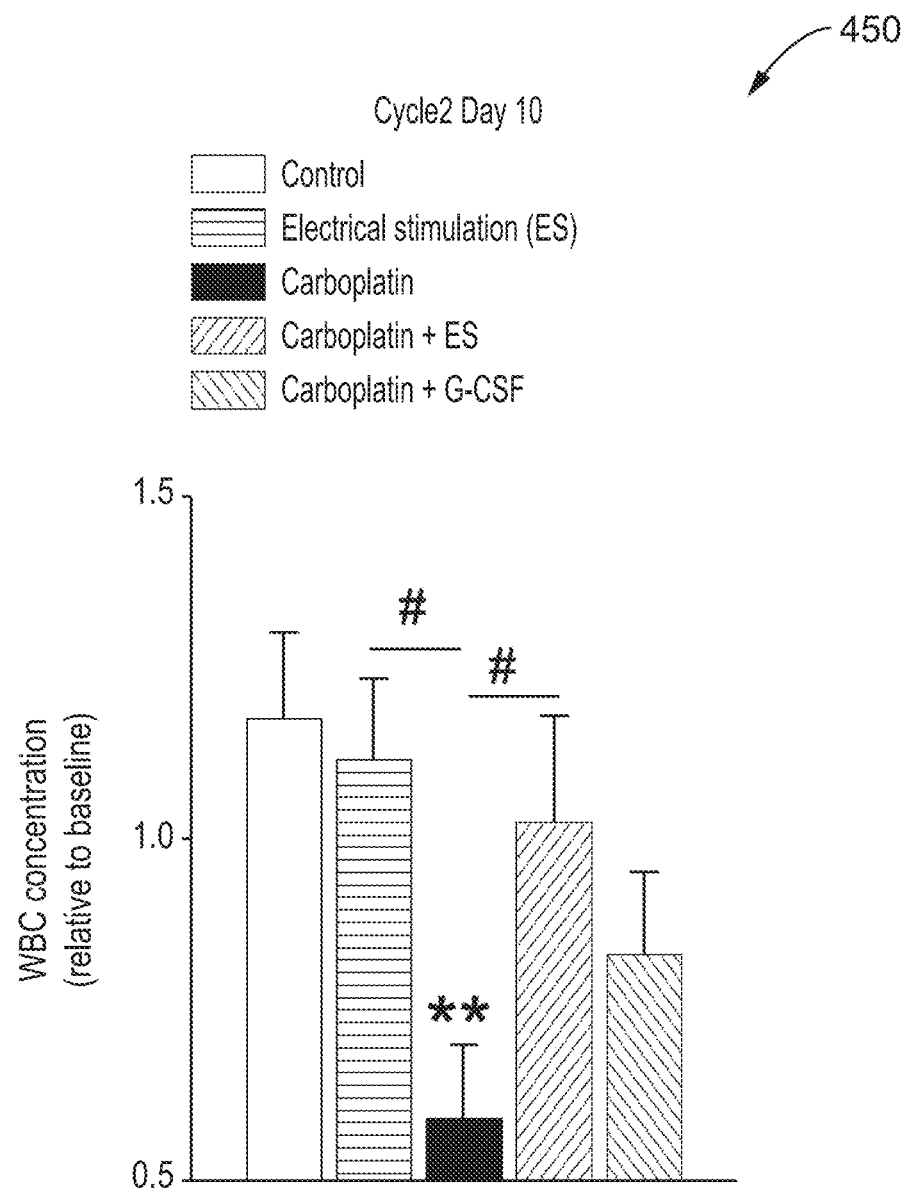

FIG. 7A through FIG. 7C illustrates an example 410, 430, 450 of results from evaluating whether ES can reduce chemotherapy agent-related hematological adverse effect. By way of example and not limitation, the specific chemotherapy agent utilized in this test was carboplatin.

In FIG. 7A is seen white blood cell concentration for each of the five groups of rats which were tested over two cycles of testing. Male SD rats (weighing 350 to 400 g) were used for studying chemotherapy-induced cytopenia. The rats were divided into five experimental groups: control group; electrical stimulation group; carboplatin group; carboplatin+electrical stimulation (ES) group; and carboplatin+G-CSF group.

In FIG. 7B and FIG. 7C are shown bar graphs of the results for each group in day 10 of the first and second cycle, respectively. The P-value for statistical analysis (P) is noted in each of these figures.

For each cycle of treatment, a single dose of carboplatin (e.g., 60 mg/kg) or vehicle (saline) was injected intraperitoneally on day 0. On day 2, electrical autonomic nerve stimulation was performed for a specified period (e.g., 60 minutes), or a single dose of G-CSF was administered on the rats according to the different experimental groups. In the example treatment each cycle of treatment is considered to be 28 days, however, a treatment cycle could span from one to eight weeks.

In at least one embodiment the nerve stimulation can be generated at frequencies from 1-100 Hz, with a current level from approximately 0.05 mA to 200 mA, using a balanced symmetric and asymmetric biphasic waveform. In at least one preferred embodiment, the frequency was approximately 20 Hz at a current level of approximately 0.5 mA and an intraburst stimulation period N of two seconds, and a burst period of approximately P=10 seconds.

Blood samples for complete blood count (CBC) were collected in EDTA tubes on various days (day 0, 2, 7, 10, 14, 17, 21, and 28).

Compared to the rats in the carboplatin group, the severity of carboplatin-induced neutropenia was significantly alleviated in the group receiving carboplatin and electrical stimulation according to the present disclosure.

Figure 8B:
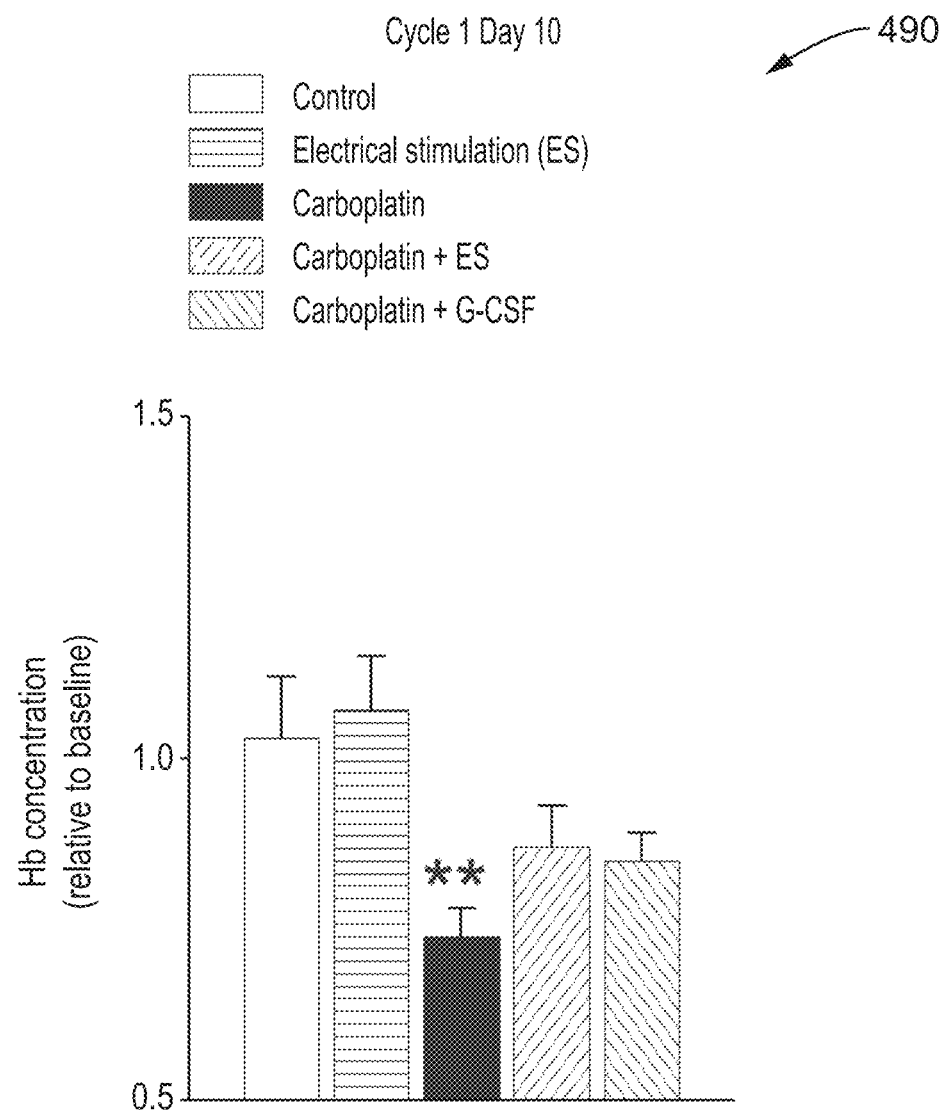
FIG. 8B and FIG. 8C are bar graphs comparing electrical stimulation (ES) and GCSF for alleviating the grading of chemotherapy-related anemia according to results obtained from at least one embodiment of the present disclosure.
Figure 8C:
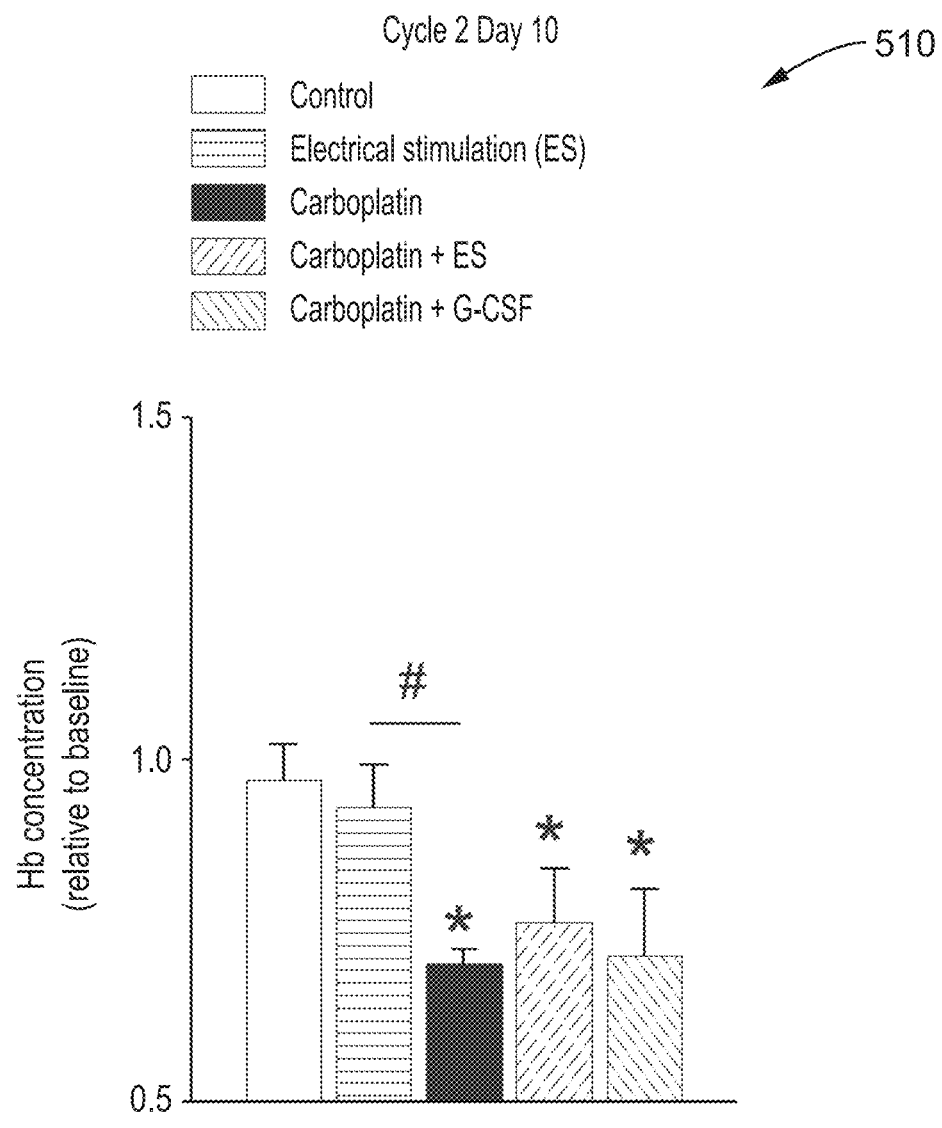

FIG. 8A through FIG. 8C illustrate an example 470, 490, 510 of results obtained from evaluating hemoglobin levels during testing of the present disclosure at each time point from the rats from the same five experimental groups.

In FIG. 8A is shown plots for each of the five groups of rats which were tested over two cycles of testing. In FIG. 8B and FIG. 8C bar graphs of the results for each group in day 10 of the first and second cycle are shown, respectively. The P-value for statistical analysis (P) is noted in each of these figures.

Whether rescue by electrical stimulation or G-CSF, the concentration of hemoglobin was both significantly decreased after carboplatin administration. It can be seen that the ES group has increased concentrations in relation to the control group, while performing ES with the carboplatin provided a notable increase in Hb concentration.

Figure 9B:
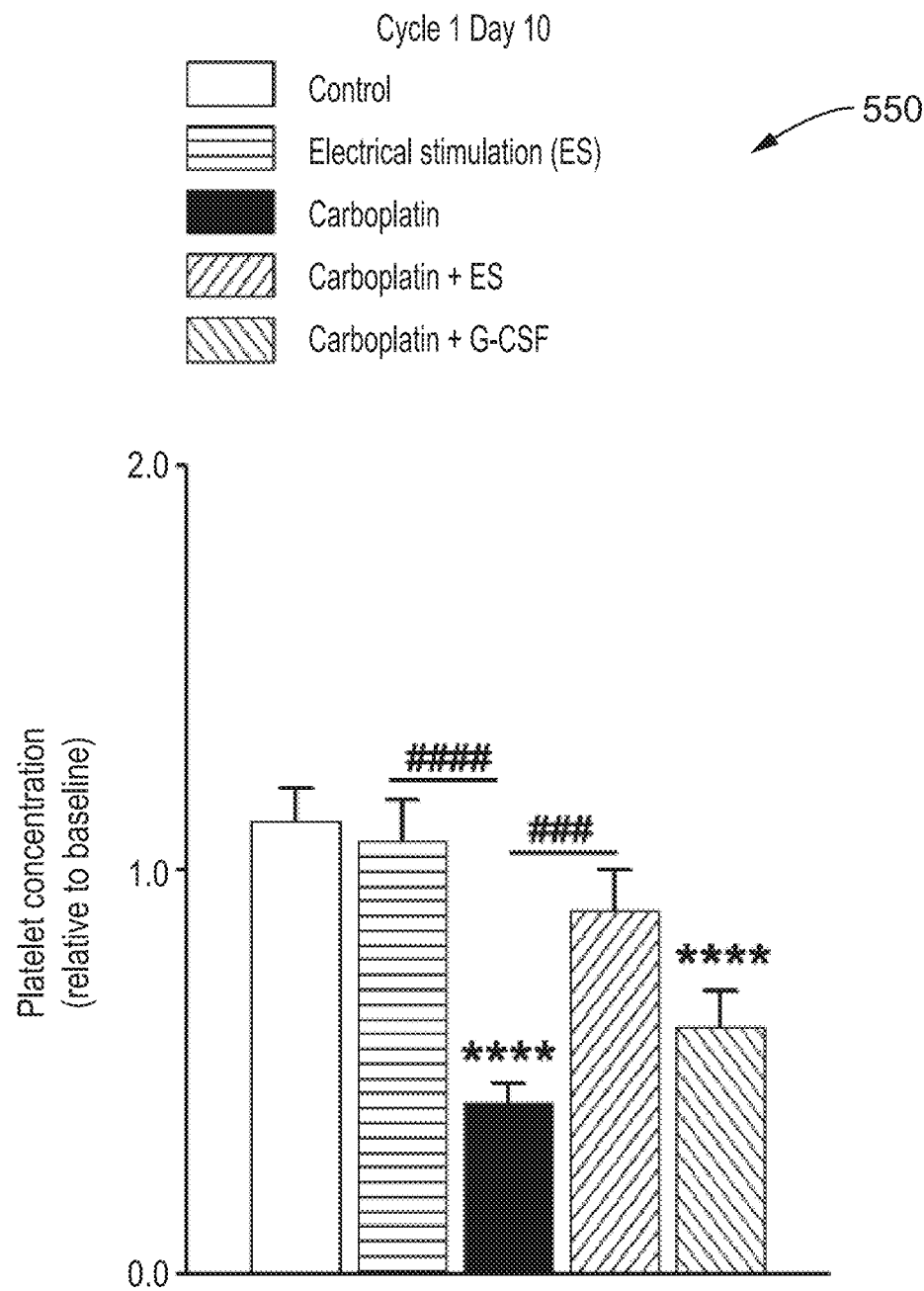
FIG. 9B and FIG. 9C are bar graphs comparing chemotherapy augmented with GCSF and with ES according to results obtained for at least one embodiment of the present disclosure.
Figure 9C:
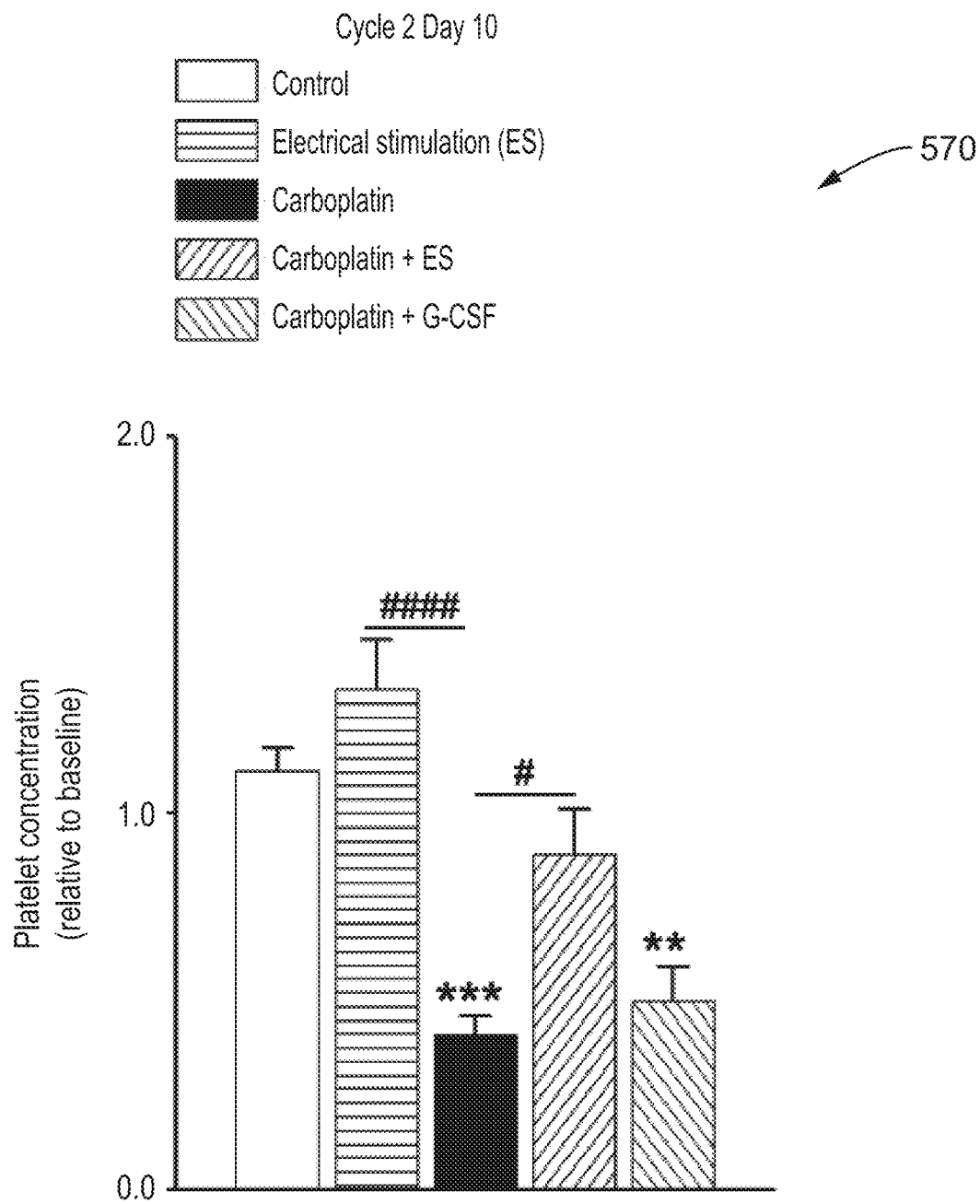

FIG. 9A through FIG. 9C illustrate an example 530, 550, 570 of results from evaluating platelet concentration at each time point from the rats in the same five experimental groups as described above.

In FIG. 9A is shown plots for each of the five groups of rats which were tested over two cycles of testing. In FIG. 9B and FIG. 9C are bar graphs of the results for each group in day 10 of the first and second cycle, respectively. The P-value for statistical analysis (P) is noted in each of these figures. It can be seen in these bar charts that compared to the control group, the platelet counts were significantly reduced in the carboplatin and carboplatin+G-CSF groups. In contrast, there is markedly higher platelet count in the carboplatin+ES group. The data demonstrates that ES alleviates the adverse effect of thrombocytopenia caused by carboplatin.

Figure 10:
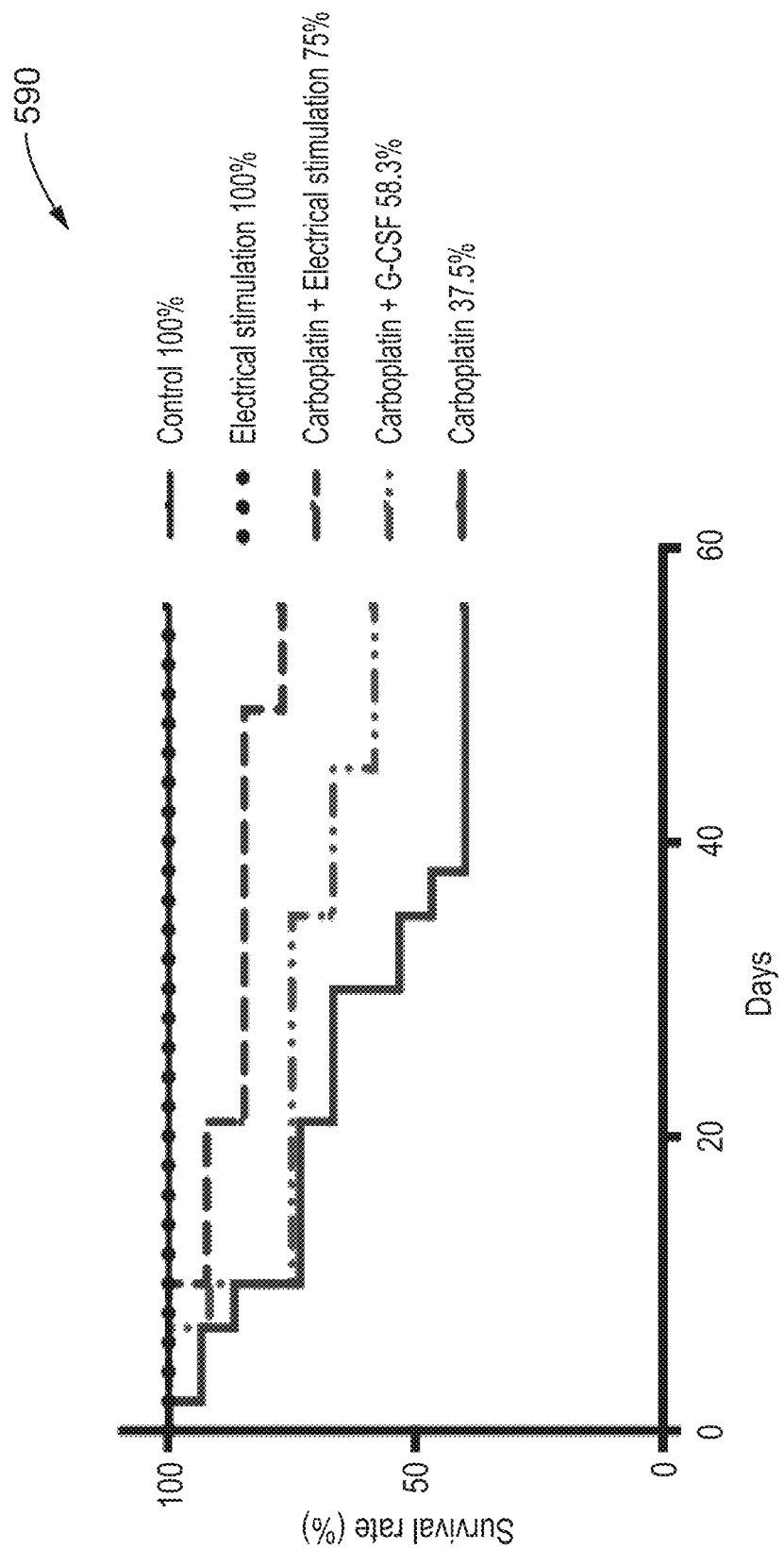
FIG. 10 is a plot of survival rates showing electrical stimulation reducing hematological adverse event and mortality after chemotherapy according to results obtained from at least one embodiment of the present disclosure.

2.1. Electrical Stimulation Reduces Hematological Adverse Events and Mortality after Chemotherapy FIG. 10 illustrates an example embodiment 590 of results indicating survival rates of the rats in the same five groups (control, ES, carboplatin, carboplatin+ES, and carboplatin+G-CSF) as previously described after two cycles of carboplatin over a period of 60 days. The figure also depicts the survival rates with the chemotherapy alone (e.g., carboplatin) at a 37.5% survival rate, and chemically augmented chemotherapy (e.g., carboplatin_G-CSF) at a 58.3 survival rate; whereas chemotherapy with the electrical stimulation resulted in a 75% survival rate.

The rats in the carboplatin+ES groups had higher survival rates compared to the carboplatin and carboplatin+G-CSF groups. ES is seen according to these tests to reduce the severity of chemotherapy-induced hematology toxicity and treatment-related mortality. Besides the recovery of the neutropenia and thrombocytopenia, electrical stimulation of sympathetic nerves can also decrease the mortality rate after two cycles of carboplatin.

Figure 11:
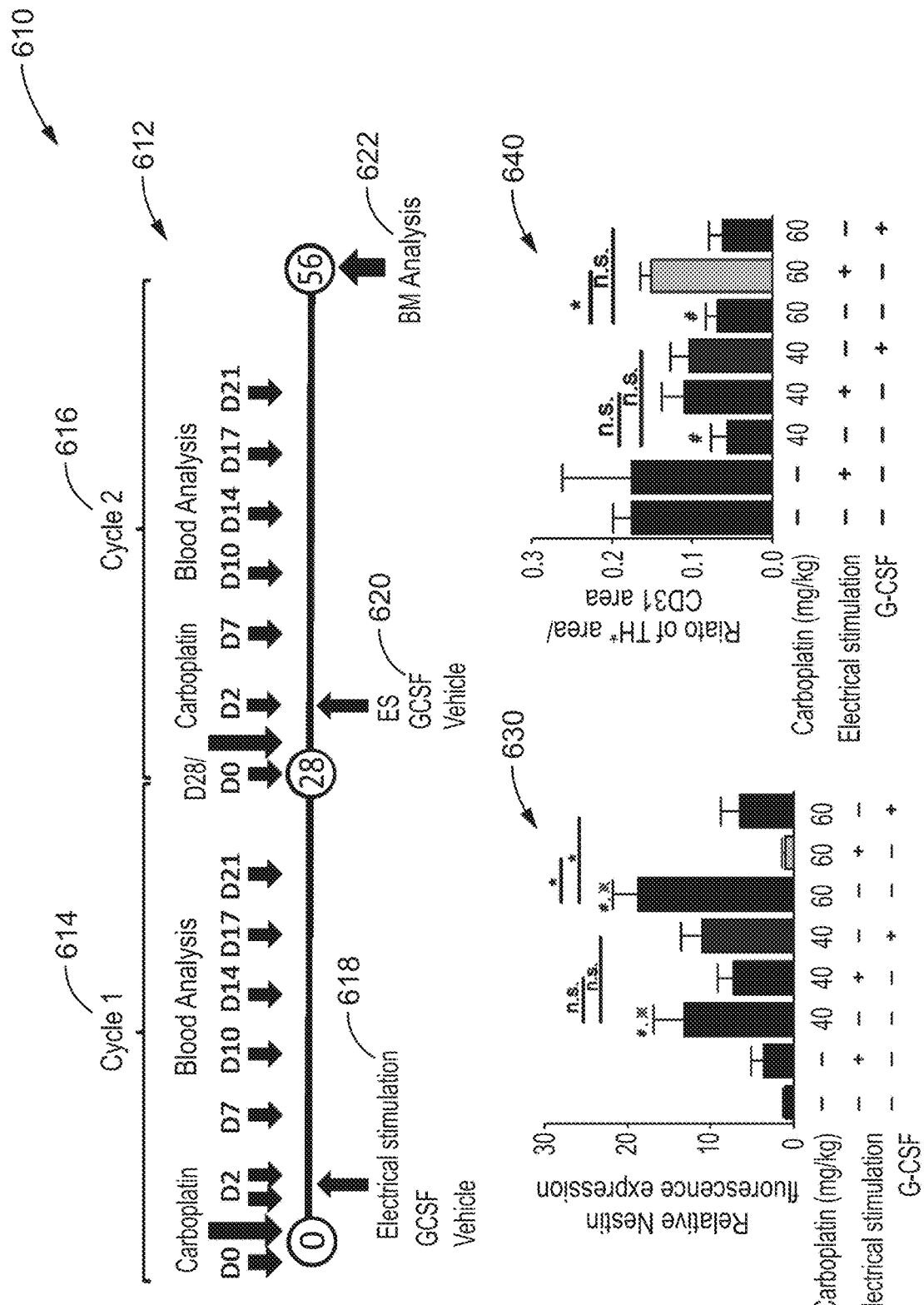
FIG. 11 are cycle diagrams and bar charts showing electrical stimulation preserving nerve and bone marrow microenvironments according to results obtained from at least one embodiment of the present disclosure.

3. Mechanism 3.1. Electrical Stimulation Preserves Nerve and Bone Marrow (BM) Microenvironment FIG. 11 illustrates example results 610 from the ES augmented treatments 612 in relation to preserving the nerve and bone marrow microenvironments. In the upper portion of the figure is shown the two cycles 614 and 616 of treatments 618 and 620, on day 0 through day 2 and the blood analysis on days 2, 7, 10, 14, 17 and 21, and BM analysis 622.

The testing utilized immunofluorescence staining of nestin for mesenchymal stem cell, tyrosine hydroxylase (TH+) for sympathetic nerve, and CD31 for vascular to evaluate the alteration of bone marrow microenvironment after three cycles of carboplatin.

As seen in the bar graphs 630 and 640 at the bottom of the figure, in comparison to the control group, there was more extensive expression of nestin from the rats receiving the chemotherapy (e.g., carboplatin). Use of carboplatin also resulted in reduced expression of TH+ in the sympathetic nerve; however, this reduction was not observed in the carboplatin+ES group. As for the area of TH+/CD31 evaluated by immunofluorescence staining, the rats in the carboplatin groups expressed lower levels than in the control group, but again this was not observed in the carboplatin+ES group.

The results indicate that exposure to chemotherapeutic agents (e.g., carboplatin) leads to damage of sympathetic nerve and proliferation of mesenchymal stem cells in compensation, and that this can be reversed through ES. These results demonstrated that carboplatin induced the damage of the sympathetic nerve and expansion of nestin+mesenchymal stem cell within bone marrow, which can be reversed by ES.

After two cycles of chemotherapy, exemplified as using carboplatin with different dosages of 40 mg/kg and 60 mg/kg, the bone marrow of the rats from the five experimental groups was analyzed by immunofluorescence to evaluate the alteration of the bone marrow microenvironment. The bone marrow tissue of rats was stained with nestin, TH and anti-CD31 antibody for mesenchymal stem cell, sympathetic nerve and endothelial cell, respectively. Compared to the control group, the area of the sympathetic nerve along with arteriole significantly decreased and the mesenchymal stem cells increased in the rats from the carboplatin group. Electrical stimulation was found to preserve the nerve structure and bone marrow microenvironment injured by chemotherapy.

Figure 12:
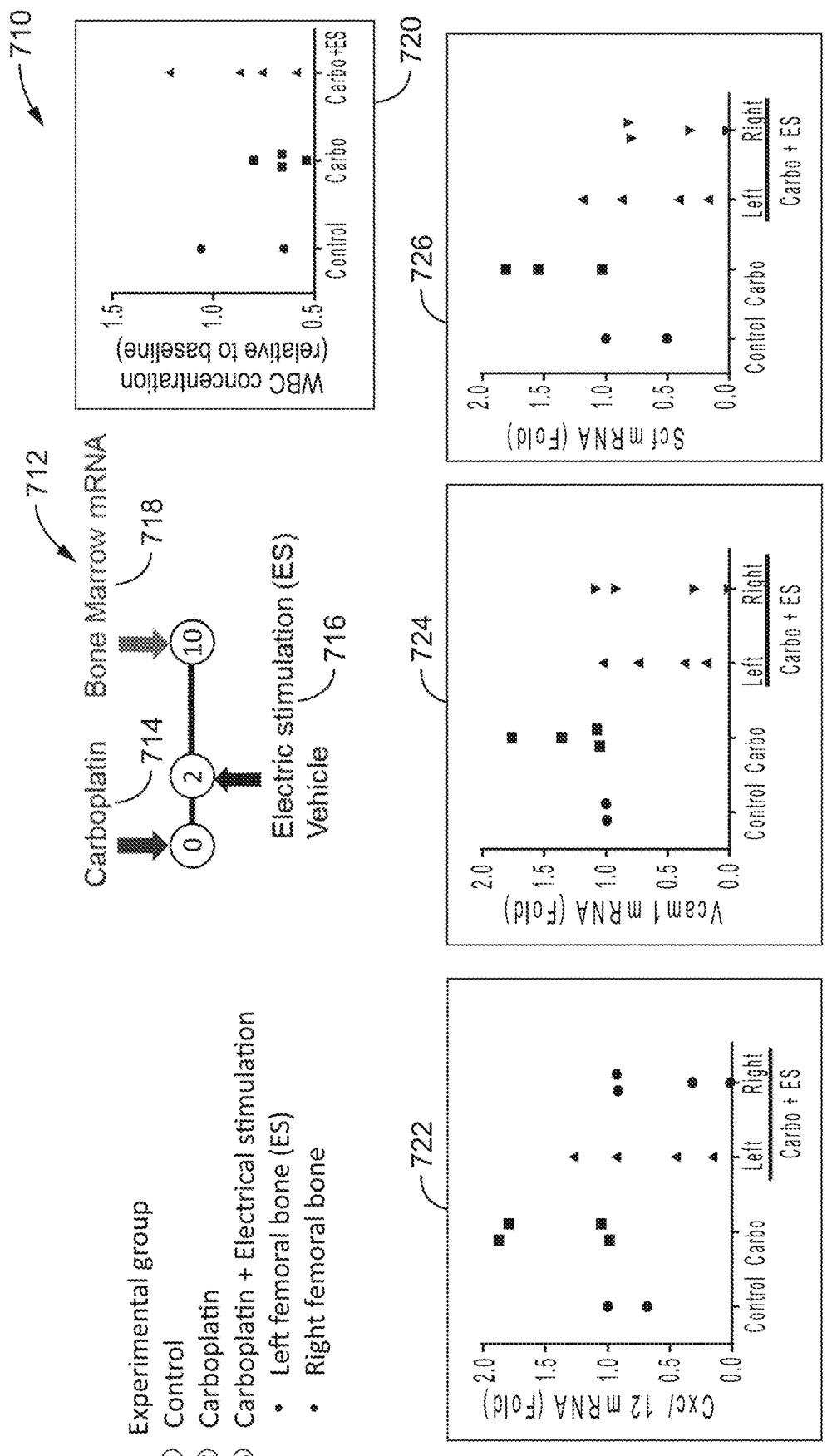
FIG. 12 are plots of mRNA levels of CXCL12, VCAM1 and SCF within bone marrow depicting how electrical stimulation degrades adhesion molecules within bone marrow and mobilizes stem cells according to results obtained for at least one embodiment of the present disclosure.

3.2. Electrical Stimulation of Sympathetic Nerve Reduces Adhesion Molecules within the Bone Marrow Microenvironment FIG. 12 illustrates an example of results 710 in which ES was found to degrade adhesion molecules within bone marrow and mobilize stem cells. In the upper portion of the figure a testing flow 712 is shown with carboplatin administration 714 at day 0, electrical stimulation (ES) 716 on day 2, and bone marrow mRNA tested 718 at day 10. Plots are shown on the right side and in the lower portion of the figure for white blood cell concentration 720, CXCL12 mRNA 722, Vcam 1 mRNA 724 and SCF mRNA 726.

The mRNA level of CXCL12, VCAM1 and SCF within bone marrow were analyzed on the 10th day after carboplatin. There was found to be decreased mRNA level of CXCL12, VCAM1 and SCF in the carboplatin+ES group compared to either the control or carboplatin groups. ES on the left sciatic nerve induced similar results on both sides of the sciatic nerve. The results show that ES can reduce the level CXCL12, VCAM1 and SCF within bone marrow, thus facilitating hematopoietic cell mobilization from bone marrow to the peripheral blood.

3.3. Electrical Stimulation of Sympathetic Nerve Reduced Adhesion Molecules within the Bone Marrow Microenvironment To study the etiology of recovery of leukopenia and thrombocytopenia after electrical stimulation, the mRNA of several types of adhesion molecules were analyzed which are responsible for the retention of hematopoietic stem cells within bone marrow. The mRNA level of CXCL12, VCAM1 and SCF were evaluated from the bone marrow of the rats receiving carboplatin and carboplatin+electrical stimulation. Both left (the side of electrical stimulation) and right (without electrical stimulation) femoral bones of the same rat from the carboplatin+electrical stimulation group were evaluated to identify whether electrical stimulation induce local or systemic effect. Accordingly, the results seen in FIG. 12 also demonstrates that electrical simulation decreases the mRNA level of CXCL12, VCAM1 and SCF, and mobilizes hematopoietic cells from bone marrow to peripheral blood consequently. Electrical stimulation induces systemic rather than local effects, since there was similar presentation from both femoral bone marrow of the same rats.

3.4. Electrical Stimulation of Sympathetic Nerve Promotes Hematopoietic Regeneration FIG. 13 and FIG. 14 illustrate example results 750, 810 and 820 of ES promoting hematopoietic regeneration.

Figure 13:
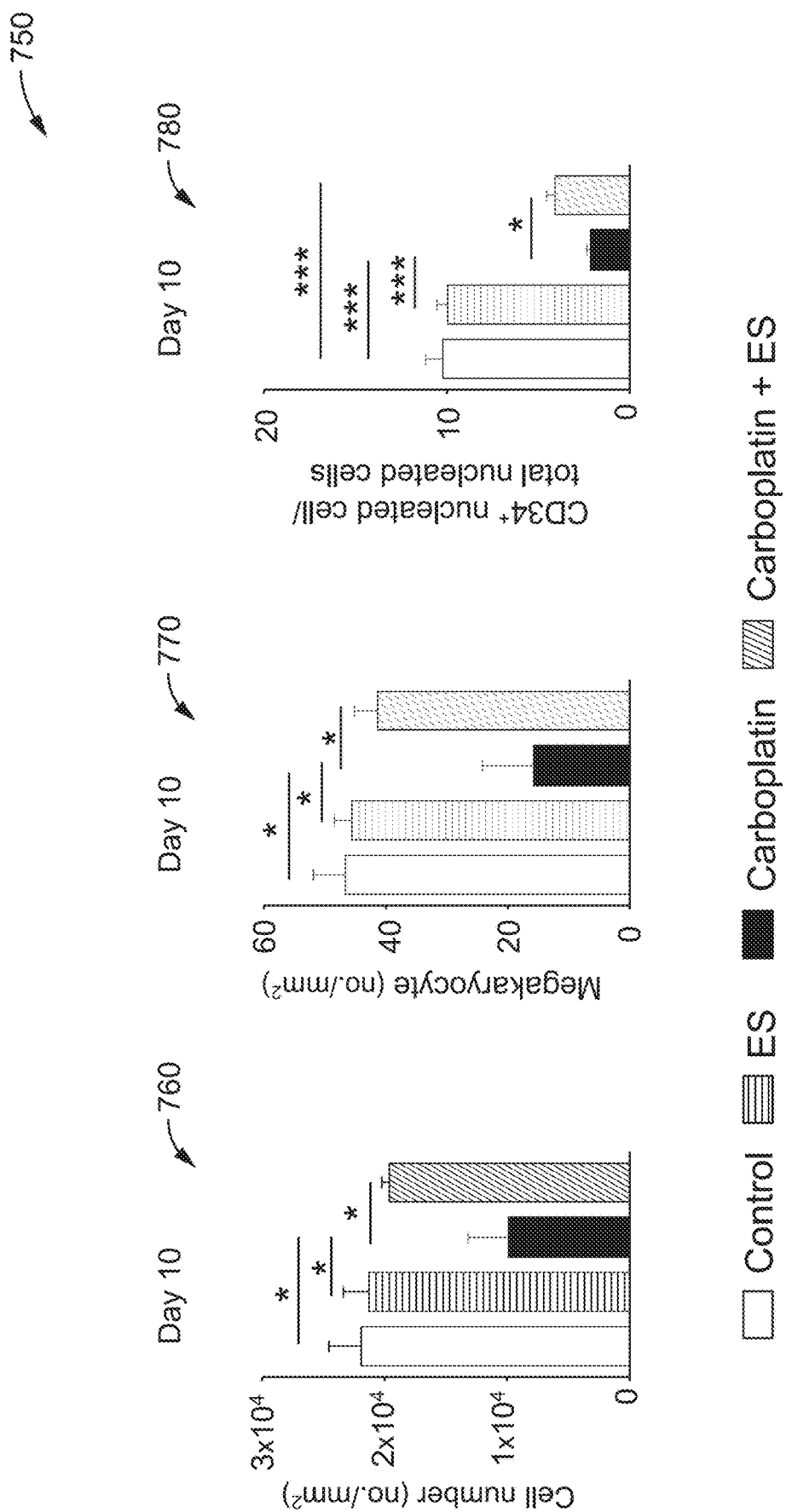
FIG. 13 are bar charts for electrical stimulation promoting hematopoietic regeneration according to at least one embodiment of the present disclosure.
Figure 14:
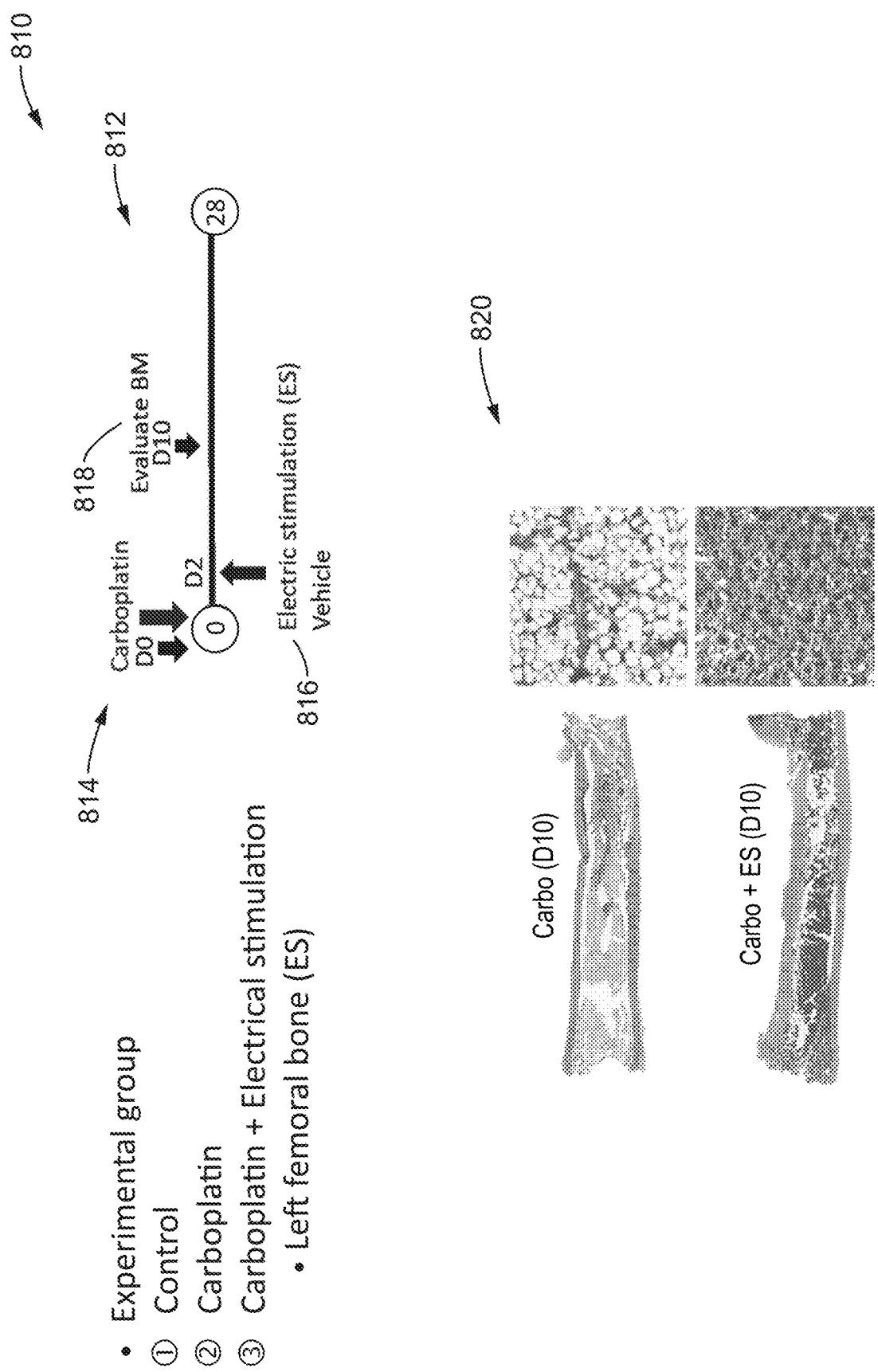
FIG. 14 is a stimulation protocol and image results from the tests of FIG. 13 according to at least one embodiment of the present disclosure.

In FIG. 13 is shown bar graphs of Cell number 760, megakaryocytes 770 and CD34 ratio of nucleated cells to total nucleated cells 780 for a control group, ES group, carboplatin group and carboplatin+ES group, shown at day of testing. In FIG. 14 the testing profile is shown 812 with carboplatin 814 followed by electrical stimulation 816, evaluating BM 818 at day 10 in a 28-day cycle. The lower portion of the figure depicts images 820 showing an image and associated close up magnification of the bone marrow for the carboplatin group (upper images) and the carboplatin+ES group (lower images).

As seen in these figures, after carboplatin treatment, the cellularity of bone marrow was significantly increased in the carboplatin+ES group, compared to the carboplatin only group. These findings indicated that ES promotes hematopoietic regeneration.

On the 10th day after carboplatin administration, the counts of total cell number, megakaryocytes and CD34+ precursor cells were significantly higher in the carboplatin+ES group compared to the carboplatin group. This data demonstrates that ES promotes hematopoietic regeneration after chemotherapy.

Figure 15:
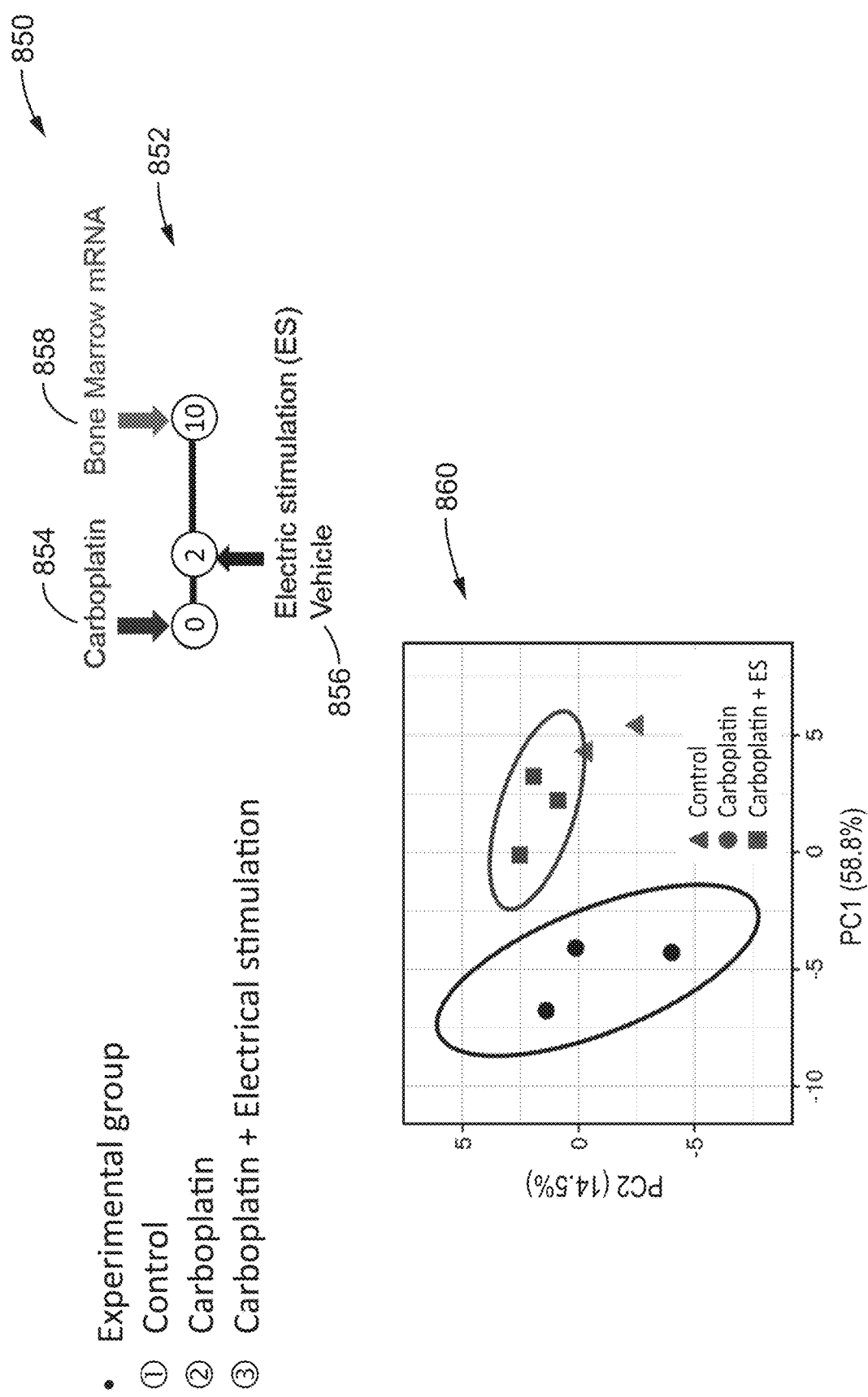
FIG. 15 is a plot comparing chemotherapy performed by itself and chemotherapy augmented with electrical stimulation (ES) showing that ES alters gene expression profile within bone marrow according to results obtained in at least one embodiment of the present disclosure.

3.5. Electrical Stimulation of Autonomic Nerve Alters Gene Expression Profile within the Bone Marrow Microenvironment FIG. 15 illustrates example results 850 in which the addition of ES was shown to alter the gene expression profile within the bone marrow. The treatment schema 852 is shown with carboplatin administration 854 at day 0, followed by ES vehicle 856 at day 2, with bone marrow RNA sequencing performed 858 on the control, carboplatin and carboplatin+ES groups at Day 10 after chemotherapy.

The lower portion of the figure depicts a clustering analysis plot 860 of the control group, carboplatin only group, and carboplatin+ES group using Principle Component Analysis.

To identify the alteration of the genetic signature after electrical stimulation, bone marrow bulk mRNA-sequencing of the rats was performed for the control, carboplatin and carboplatin+ES groups. The plot 860 demonstrates that the gene modulating cell migration and activation revealed different gene expression levels among the rats of different groups. It can be seen that the data points for carboplatin+ES are clustered close to the control group while is separated from the carboplatin group using Principal Component Analysis—PC1 and PC2. The above demonstrates ES is able to alter the genetic signature which modulates cell migration and activation, and thus facilitate recovery.

3.6. Indirect Nerve Stimulation

Figure 16:
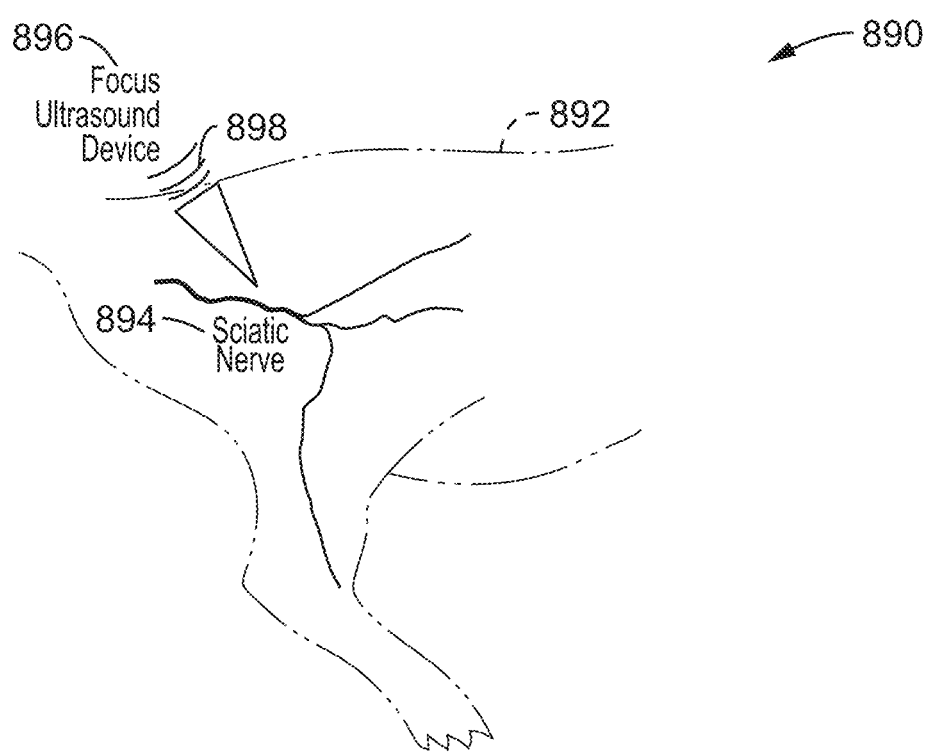
FIG. 16 is a stimulation diagram of performing nerve stimulation utilizing an indirect stimulation source exemplified as an ultrasonic source, according to at least one embodiment of the present disclosure.

FIG. 16 illustrates an example 890 of indirect nerve stimulation, as described in Section 1.3, that may be utilized in the present disclosure. In some applications rather than directly stimulating the nerve with electrical signals passing through the electrode(s), the stimulation can be indirectly created. In the example shown a focused ultrasonic beam(s) 898 from an ultrasonic device 896 is direct at the nerve 894 (e.g., such as the sciatic nerve shown) being innervated on test subject 892.

4. CONCLUSION

Figure 17:
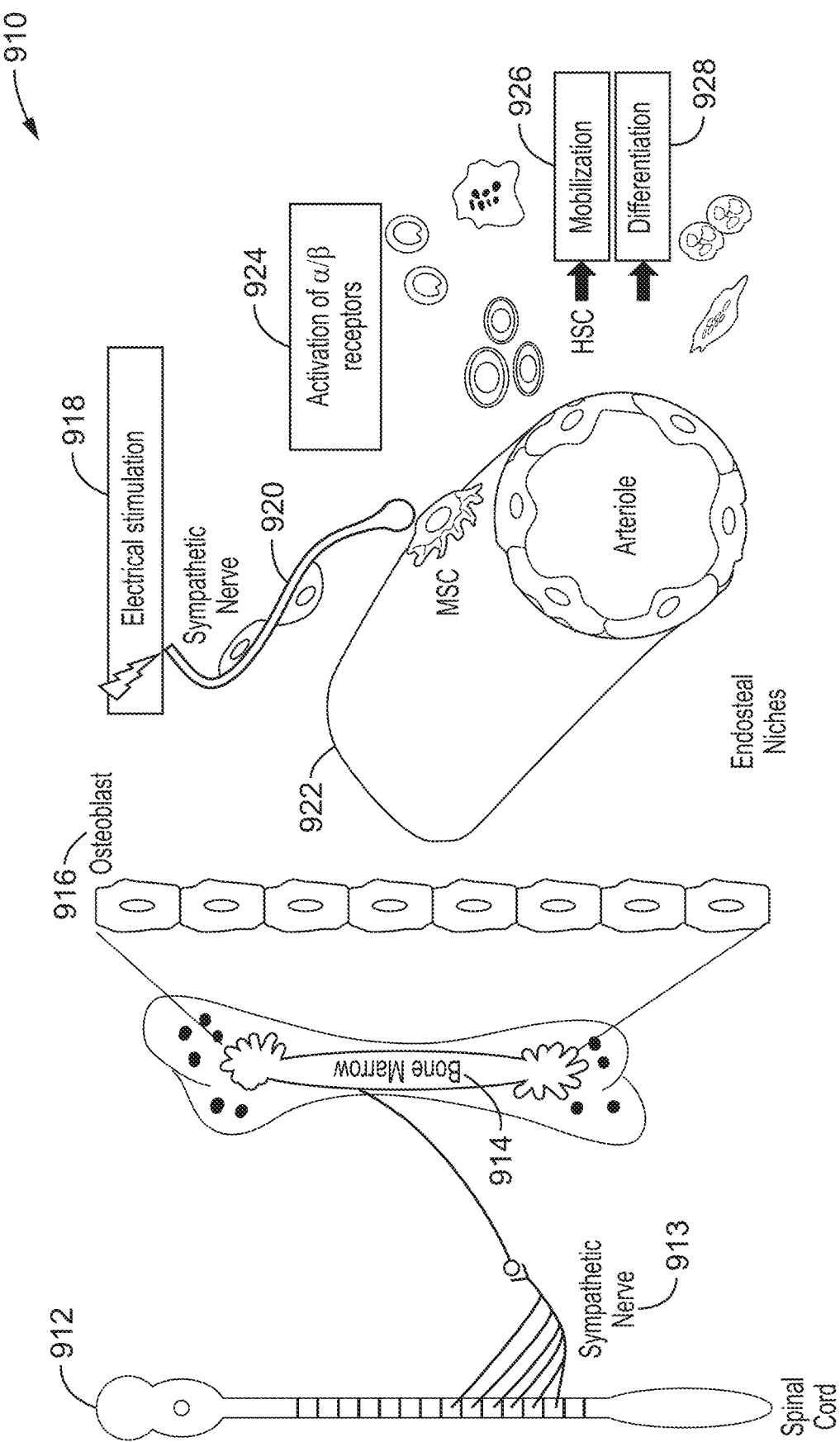
FIG. 17 is a pictorial sequence on how electrical stimulation (ES) modulates hematopoiesis and the bone marrow microenvironment according to at least one embodiment of the present disclosure.

FIG. 17 illustrates an example embodiment 910 showing how the use of electrical stimulation (ES) modulates hematopoiesis and bone marrow microenvironment. Sympathetic nerves 913 from the spinal cord 912, begin at the first thoracic vertebra of the vertebral column and extend to the second or third lumbar vertebra. The postsynaptic sympathetic nerves enter into bone marrow 914 to regulate bone marrow niche. Electrical simulation 918 of sympathetic nerve 920 within bone marrow can activate the adrenergic receptors 924. on arteriole 922, to promote differentiation 928 and facilitate mobilization 926 of Hematopoiesis Stem Cell (HSC), which alleviates chemotherapy-related hematologic toxicity.

In conclusion, through electrical stimulating of bone marrow sympathetic nerve, the apparatus and method according to the present disclosure is able to promote hematopoietic mobilization and regeneration, which reduces chemotherapy-induced hematologic toxicity. ES can also rescue sympathetic nerves from chemotherapy-related injury and preserve the bone marrow microenvironment.

5. General Scope of the Embodiments

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula (e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

An apparatus for generating electrical stimulation innervating patient bone marrow to reduce chemotherapy impacts on hematopoiesis, comprising: (a) a control circuit configured for receiving stimulation parameters for electrical stimulation innervating patient bone marrow to reduce chemotherapy impacts on hematopoiesis; (b) an electrode driver circuit coupled to said control circuit; (c) at least one electrode configured for receiving drive voltage/current from said electrode driver circuit, said at least one electrode configured for being implanted in a patient for innervating patient bone marrow; (d) wherein said control circuit is configured for converting said stimulation parameters into a series of basic building block waveforms (BBWs) with amplitudes, pulse width, inter-pulse delay, and stimulation frequencies according to said stimulation parameters, and outputting waveform signals, having pulse trains (PTs), each PT of which comprises a series of N basic building waveforms (BBWs), which are output to said electrode driver circuit; (e) wherein said electrode driver circuit is configured for receiving said waveform signals from said control circuit, and for driving said at least one electrode with a temporal pattern having single pulses and multiple pulse groups separated by inter-pulse intervals; and (f) whereby said electrical stimulation triggers nerve fibers that innervate patient bone marrow toward priming its microenvironments after chemotherapy toward reducing hematologic toxicity and mortality.

An apparatus for generating electrical stimulation innervating patient bone marrow to reduce chemotherapy impacts on hematopoiesis, comprising: (a) a control circuit configured for receiving stimulation parameters for electrical stimulation innervating patient bone marrow to reduce chemotherapy impacts on hematopoiesis; (b) an electrode driver circuit coupled to said control circuit; (c) at least one electrode array configured for receiving drive voltage/current from said electrode driver circuit, said electrode array configured for being implanted in a patient for innervating patient bone marrow; (d) wherein said control circuit is configured for converting said stimulation parameters into a series of basic building block waveforms (BBWs) with amplitudes, pulse width, inter-pulse delay, and stimulation frequencies according to said stimulation parameters, and outputting waveform signals, having pulse trains (PTs), each PT of which comprises a series of N basic building waveforms (BBWs), which are output to said electrode driver circuit; (e) wherein said electrode driver circuit is configured for receiving said waveform signals from said control circuit, and for driving said electrode array with a temporal pattern having single pulses and multiple pulse groups separated by inter-pulse intervals, wherein each said electrode in said electrode array is spatially directed with a focusing pattern in which different electrodes of the array can be driven at different amplitudes from positive to negative, toward creating an optimal electrode array montage of electrical stimulation; and (f) whereby said electrical stimulation triggers nerve fibers that innervate patient bone marrow toward priming its microenvironments after chemotherapy toward reducing hematologic toxicity and mortality; and (g) wherein said control circuit in combination with said electrode driver circuit are configured for selectively applying electrical pulses to said at least one electrode array in a waveform consisting of: (g)(i) a frequency from approximately 2 Hz to approximately 100 Hz; (g)(ii) a duration of each phasic pulse of approximately 0.05 ms to approximately 3 ms; (g)(iii) a pulse train having a stimulation on period of approximately 1 to approximately seconds, at a frequency of approximately 2 Hz to approximately 100 Hz, and a stimulation off period of approximately 1 second to approximately 10 seconds; (g)(iv) a pulse train amplitude of approximately 0.05 mA to approximately 200 mA; and (g)(v) a simulation duration of approximately 1 minute to approximately 90 minutes with a repeating pattern pulse train.

A method for reducing chemotherapy impacts on hematopoiesis, the method comprising: (a) receiving stimulation parameters from a user interface of a control circuit; (b) converting said stimulation parameters into a series of basic building block waveforms (BBWs) with amplitudes, pulse width, inter-pulse delay, and stimulation frequencies according to said stimulation parameters; (c) generating waveform signals from said BBWs and outputting said waveform signals having pulse trains (PTs), each PT of which comprises a series of N basic building waveforms (BBWs), configured for output to an electrode driver circuit; (d) performing electrical stimulation in a treatment for innervating patient bone marrow to reduce chemotherapy impacts on hematopoiesis in response to driving an implanted electrode array with a temporal pattern of said waveform signals having single pulses and multiple pulse groups separated by inter-pulse intervals, wherein each said electrode in said electrode array is spatially directed with a focusing pattern in which different electrodes of the array can be driven at different amplitudes from positive to negative, toward creating an optimal electrode array montage of electrical stimulation; and (e) whereby said electrical stimulation triggers nerve fibers that innervate patient bone marrow toward priming its microenvironments after chemotherapy toward reducing hematologic toxicity and mortality.

A method that accelerates the recovery of cytopenia after chemotherapy, the method comprising applying a therapeutic protocol of electrical stimulus to sympathetic nerves.

A method that accelerates the recovery of cytopenia after chemotherapy, the method comprising applying a therapeutic protocol of multicycles of electrical stimulus to sympathetic nerves.

A therapeutic protocol comprising electrical activations applied to sympathetic nerves after chemotherapy which accelerate recovery of cytopenia.

A therapeutic protocol comprising multicycles of electrical activations applied to sympathetic nerves after chemotherapy which accelerate recovery of cytopenia.

A stimulation apparatus for applying a therapeutic protocol of electrical stimulus to sympathetic nerves after chemotherapy, the apparatus comprising: (a) a power management unit; (b) a control unit; (c) a driver unit; (d) an electrode unit; (e) a user interface; (f) said control unit configured selectively applying electrical pulses to said electrode unit with one or more parameters selected from the group of parameters consisting of: (f)(i) Frequency: about 2 Hz to about 100 Hz; (f)(ii) Waveform: Balanced (symmetry) Biphasic square wave with inter-phasic delay (about 0 to about 1 ms); (f)(iii) Waveform: Monophasic Square Pulse; (f)(iv) Duration of each phasic pulse: about 0.05 ms to about 3 ms; (f)(v) Pulse train: stimulation on (about 1 to about 5 seconds) at about 2 Hz to about 100 Hz and stimulation off (about 1 to about 10 seconds). For example, about 1 second on at about Hz and about 9 seconds off; (f)(vi) Amplitude: about 0.1 mA to about 1.5 mA; and (f)(vii) Simulation duration: about 1 to about 90 minutes with a repeating pattern defined by "Pulse train". For example, about 1 second on at about 20 Hz and about 9 second off for 60 minutes (total pulses: 20 pulses×60 secs/min×60 mins/10 secs=20×360 pulses=7,200 pulses for 60 minutes).

The apparatus or method of any preceding implementation, wherein said at least one electrode comprises an electrode array; and wherein each said electrode in said electrode array is spatially directed with a focusing pattern in which different electrodes of the array are driven by said electrode driver circuit at different amplitudes from positive to negative, toward creating an optimal electrode array montage of electrical stimulation.

The apparatus or method of any preceding implementation, wherein said chemotherapy comprises a chemotherapy treatment in which carboplatin is administered.

The apparatus or method of any preceding implementation, wherein said electrode array configured for being implanted proximal sympathetic nerves, or spleen, or the vagus nerve and its associated branches.

The apparatus or method of any preceding implementation, wherein said electrode driver circuit is also configured for being implanted.

The apparatus or method of any preceding implementation, wherein said control circuit is also configured for being implanted.

The apparatus or method of any preceding implementation, wherein a one-shot-protocol (OSP) is performed comprising a pulse train (PT) followed by an idle latency of the one-shot period (P) minus active portion of stimulation waveform (N).

The apparatus or method of any preceding implementation, wherein said OSP is repeatedly generated until a counter D has expired ending the protocol.

The apparatus or method of any preceding implementation, wherein said pulse width is randomized toward enhancing stimulation performance.

The apparatus or method of any preceding implementation, wherein said inter-pulse intervals comprise constant and/or randomized inter-pulse intervals.

The apparatus or method of any preceding implementation, wherein said waveform signals are generated in the form of natural biomimetic waveforms which mimic biological signals representing firing sequences and oscillation patterns by a neuron or a cluster system of neurons.

The apparatus or method of any preceding implementation, wherein said waveform signals are generated in the form of synthetic biomimetic waveforms with randomized interphasic delay, pulse width and amplitude at either a Poisson or Gaussian distribution.

The apparatus or method of any preceding implementation, wherein said control circuit is configured to allow changing the basic building waveforms of the pulse trains every P periods.

The apparatus or method of any preceding implementation, wherein said stimulation parameters specifying stimulation waveforms comprise specifications for polarity including leading cathodic or anodic, mode as to whether output levels are directed to voltage or current, indicating if the waveform is bi-phasic and whether it is symmetric bi-phasic or asymmetric biphasic), waveforms amplitudes, pulse widths, and delay times.

The apparatus or method of any preceding implementation, wherein said basic building block waveforms comprise mono-phasic stimulation as cathodic stimulation, mono-phasic stimulation as anodic stimulation, bi-phasic stimulation pulses with balanced symmetry as cathodic leading, bi-phasic stimulation pulses with balanced symmetry as anodic leading, bi-phasic stimulation pulses with balanced asymmetry as cathodic leading, and bi-phasic stimulation pulses with balanced asymmetry as anodic leading.

The apparatus or method of any preceding implementation, wherein said controller circuit comprises a sequencing circuit.

The apparatus or method of any preceding implementation, wherein said sequencing circuit is selected from the group of sequencing circuits consisting of a microcontroller containing firmware, System-on-Chip (SoC), Application-Specific Integrated Circuit (ASIC), and combinations thereof.

The apparatus or method of any preceding implementation, wherein said electrode driver circuit comprises at least one multi-bit digital-analog converter (DAC) outputting a signal to a current mirror for inducing an output current/voltage to the attached at least one electrode.

The apparatus or method of any preceding implementation, wherein said electrode driver circuit is further configured with a power and data management circuit comprising at least one regulator, at least one rectifier, at least one voltage and/or current converter, and at least one data buffer.

The apparatus or method of any preceding implementation, wherein said chemotherapy comprises a chemotherapy treatment in which carboplatin is administered.

The apparatus or method of any preceding implementation, wherein said electrode array is configured for being implanted proximal sympathetic nerves, or spleen, or the vagus nerve and its associated branches.

The apparatus or method of any preceding implementation, wherein said electrode driver circuit is also configured for being implanted.

The apparatus or method of any preceding implementation, wherein said control circuit is also configured for being implanted.

The apparatus or method of any preceding implementation, wherein a one-shot-protocol (OSP) is performed comprising a PT followed by an idle latency of one-shot period (P) minus the active portion of the stimulation waveform (N).

The apparatus or method of any preceding implementation, wherein said OSP is repeatedly generated until a counter D has expired ending the protocol.

The apparatus or method of any preceding implementation, wherein said pulse width is randomized toward enhancing stimulation performance.

The apparatus or method of any preceding implementation, wherein said inter-pulse intervals comprise constant and/or randomized inter-pulse intervals.

The apparatus or method of any preceding implementation, wherein said control circuit is configured to allow changing the basic building waveforms of the pulse trains every P periods.

The apparatus or method of any preceding implementation, wherein said stimulation parameters specifying stimulation waveforms comprise specifications for polarity including leading cathodic or anodic, mode as to whether output levels are directed to voltage or current, indicating if the waveform is bi-phasic and whether it is symmetric bi-phasic or asymmetric biphasic), waveforms amplitudes, pulse widths, and delay times.

The apparatus or method of any preceding implementation, wherein said basic building block waveforms comprise mono-phasic stimulation as cathodic stimulation, mono-phasic stimulation as anodic stimulation, bi-phasic stimulation pulses with balanced symmetry as cathodic leading, bi-phasic stimulation pulses with balanced symmetry as anodic leading, bi-phasic stimulation pulses with balanced asymmetry as cathodic leading, and bi-phasic stimulation pulses with balanced asymmetry as anodic leading.

The apparatus or method of any preceding implementation, wherein said waveform signals are generated in the form of natural biomimetic waveforms which mimic biological signals representing firing sequences and oscillation patterns by a neuron or a cluster system of neurons.

The apparatus or method of any preceding implementation, wherein said waveform signals are generated in the form of synthetic biomimetic waveforms with randomized interphasic delay, pulse width and amplitude at either a Poisson or Gaussian distribution.

The apparatus or method of any preceding implementation, wherein said controller circuit comprises a sequencing circuit.

The apparatus or method of any preceding implementation, wherein said sequencing circuit is selected from the group of sequencing circuits consisting of a microcontroller containing firmware, System-on-Chip (SoC), Application-Specific Integrated Circuit (ASIC), and combinations thereof.

The apparatus or method of any preceding implementation, wherein said electrode driver circuit comprises at least one multi-bit digital-analog converter (DAC) outputting a signal to a current mirror for inducing an output current/voltage to the attached at least one electrode.

The apparatus or method of any preceding implementation, wherein said electrode driver circuit is further configured with a power and data management circuit comprising at least one regulator, at least one rectifier, at least one voltage and/or current converter, and at least one data buffer.

The apparatus or method of any preceding implementation, wherein said pulse train is generated as a repeating pattern pulse train.

The apparatus or method of any preceding implementation, wherein said control circuit is configured for communicating with said electrode driver circuit with either wired, or wireless, communications.

The apparatus or method of any preceding implementation, wherein said control circuit is configured for communicating with a user interface with either wired, or wireless, communications.

The apparatus or method of any preceding implementation, wherein said at least one electrode array comprises an electrode array with a first dimension having from 3 to 9 electrodes, and a second dimension having from 3 to 9 electrodes; and wherein said controller circuit is configured for controlling said electrode driver circuit in establishing a stimulation current montage to focus on the targeted nerve of sympathetic nerves.

The apparatus or method of any preceding implementation, wherein said treatment comprises multiple cycles of electrical stimulation (ES) within a treatment cycle.

The apparatus or method of any preceding implementation, wherein said treatment comprises three cycles of electrical stimulation (ES) within a treatment cycle.

The apparatus or method of any preceding implementation, wherein said treatment cycle comprises 28 days.

The apparatus or method of any preceding implementation, wherein said waveform signals are generated comprising: (a) generating a pulse train of phasic pulses having a frequency from approximately 2 Hz to approximately 100 Hz, with each phasic pulse having a duration of approximately 0.05 ms to approximately 3 ms; (b) generating said pulse train having a stimulation on period of approximately 1 to approximately 5 seconds, and a stimulation off period of approximately 1 second to approximately 10 seconds; (c) generating said pulse train with amplitudes of from approximately mA to approximately 200 mA; and (d) generating a stimulation duration of said pulse train for approximately 1 minute to approximately 90 minutes with a repeating pattern pulse train.

The apparatus or method of any preceding implementation, further comprising generating said waveform signals as natural biomimetic waveforms which mimic biological signals representing firing sequences and oscillation patterns by a neuron or a cluster system of neurons.

The apparatus or method of any preceding implementation, further comprising generating said waveform signals as synthetic biomimetic waveforms with randomized interphasic delay, pulse width and amplitude at either a Poisson or Gaussian distribution.

The apparatus or method of any preceding implementation, further comprising: (a) a wireless receiver or transceiver associated with the control unit; and (b) wherein the user interface comprises a wireless user interface unit.

The apparatus or method of any preceding implementation, wherein the electrode unit comprises an electrode array with one dimension of the legitimate combinations of [3, 4, 5, 6, 7, 8, 9]×[3, 4, 5, 6, 7, 8, 9]; and wherein the controller is configured for setup stimulation current montage to focus on the targeted nerve of sympathetic nerves, including femur and sciatic nerves.

The apparatus or method of any preceding implementation, wherein the electrode unit comprises an electrode array with one dimension of the legitimate combinations of [3, 4, 5, 6, 7, 8, 9]×[3, 4, 5, 6, 7, 8, 9]; and wherein the controller is configured for setup stimulation current montage to focus on the target nerve of sympathetic nerves, including femur and sciatic nerves.

As used herein, the term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these groups of elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system, or method.

As used herein, the term "set" refers to a collection of one or more objects. Thus, for example, a set of objects can include a single object or multiple objects.

Relational terms such as first and second, top and bottom, upper and lower, left and right, and the like, may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, apparatus, or system, that comprises, has, includes, or contains a list of elements does not include only those elements but may include other elements not expressly listed or inherent to such process, method, article, apparatus, or system. An element proceeded by "comprises . . . a", "has . . . a", "includes . . . a", "contains . . . a" does not, without more constraints, preclude the existence of additional identical elements in the process, method, article, apparatus, or system, that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential feature or element of the technology described herein or any or all the claims.

In addition, in the foregoing disclosure various features may be grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after the application is filed. Accordingly, the reader should consult the application as filed for the original content of the disclosure. Any deletion of content of the disclosure should not be construed as a disclaimer, forfeiture, or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure, but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus capable of innervating patient bone marrow to reduce chemotherapy impacts on hematopoiesis, comprising:
    (a) a control circuit configured for receiving stimulation parameters for controlling electrical stimulation innervating patient bone marrow to reduce chemotherapy impacts on hematopoiesis;
    (b) an electrode driver circuit coupled to said control circuit;
    (c) at least one electrode configured for receiving drive voltage/current from said electrode driver circuit, said at least one electrode configured for being implanted in a patient configured to innervate a patient's bone marrow;
    (d) wherein said control circuit is configured for converting said stimulation parameters into a series of basic building block waveforms (BBWs) with amplitudes, pulse width, inter-pulse delay, and stimulation frequencies according to said stimulation parameters, and outputting waveform signals, having pulse trains (PTs), each PT of which comprises a series of N basic building waveforms (BBWs), which are output to said electrode driver circuit;
    (e) wherein said electrode driver circuit is configured for receiving said waveform signals from said control circuit, and for driving said at least one electrode with a temporal pattern having single pulses and multiple pulse groups separated by inter-pulse intervals; and
    (f) whereby said electrical stimulation is configured to trigger nerve fibers that innervate patient bone marrow toward preserving its microenvironments after chemotherapy toward reducing hematologic toxicity and mortality.

2. The apparatus of claim 1:
    wherein said at least one electrode comprises an electrode array; and
    wherein each said electrode in said electrode array is spatially directed with a focusing pattern in which different electrodes of the array are driven by said electrode driver circuit at different amplitudes from positive to negative, toward creating an optimal electrode array montage of electrical stimulation.

3. The apparatus of claim 1, wherein said chemotherapy comprises a chemotherapy treatment in which carboplatin is administered.

4. The apparatus of claim 1, wherein said electrode array configured for being implanted to access sympathetic nerves, or spleen, or the vagus nerve and its associated branches.

5. The apparatus of claim 4, wherein said electrode driver circuit is also configured for being implanted.

6. The apparatus of claim 5, wherein said control circuit is also configured for being implanted.

7. The apparatus of claim 1, wherein a one-shot-protocol (OSP) is performed comprising a pulse train (PT) followed by an idle latency of the one-shot period (P) minus active portion of stimulation waveform (N).

8. The apparatus of claim 7, wherein said OSP is repeatedly generated until a counter D has expired ending the protocol.

9. The apparatus of claim 1, wherein said pulse width is randomized toward enhancing stimulation performance.

10. The apparatus of claim 1, wherein said inter-pulse intervals comprise constant and/or randomized inter-pulse intervals.

11. The apparatus of claim 1, wherein said waveform signals are generated in the form of natural biomimetic waveforms which mimic biological signals representing firing sequences and oscillation patterns by a neuron or a cluster system of neurons.

12. The apparatus of claim 1, wherein said waveform signals are generated in the form of synthetic biomimetic waveforms with randomized interphasic delay, pulse width and amplitude at either a Poisson or Gaussian distribution.

13. The apparatus of claim 1, wherein said control circuit is configured to allow changing the basic building waveforms of the pulse trains every P periods.

14. The apparatus of claim 1, wherein said stimulation parameters specifying stimulation waveforms comprise specifications for polarity including leading cathodic or anodic, mode as to whether output levels are directed to voltage or current, indicating if the waveform is bi-phasic and whether it is symmetric bi-phasic or asymmetric biphasic, waveforms amplitudes, pulse widths, and delay times.

15. The apparatus of claim 1, wherein said basic building block waveforms comprise mono-phasic stimulation as cathodic stimulation, mono-phasic stimulation as anodic stimulation, bi-phasic stimulation pulses with balanced symmetry as cathodic leading, bi-phasic stimulation pulses with balanced symmetry as anodic leading, bi-phasic stimulation pulses with balanced asymmetry as cathodic leading, and bi-phasic stimulation pulses with balanced asymmetry as anodic leading.

16. The apparatus of claim 1, wherein said controller circuit comprises a sequencing circuit.

17. The apparatus of claim 16, wherein said sequencing circuit is selected from the group of sequencing circuits consisting of a microcontroller containing firmware, System-on-Chip (SoC), Application-Specific Integrated Circuit (ASIC), and combinations thereof.

18. The apparatus of claim 1, wherein said electrode driver circuit comprises at least one multi-bit digital-analog converter (DAC) outputting a signal to a current mirror for inducing an output current/voltage to the attached at least one electrode.

19. The apparatus of claim 1, wherein said electrode driver circuit is further configured with a power and data management circuit comprising at least one regulator, at least one rectifier, at least one voltage and/or current converter, and at least one data buffer.

20. An apparatus for generating electrical stimulation innervating patient bone marrow to reduce chemotherapy impacts on hematopoiesis, comprising:
(a) a control circuit configured for receiving stimulation parameters for electrical stimulation innervating a patient's bone marrow to reduce chemotherapy impacts on hematopoiesis;
(b) an electrode driver circuit coupled to said control circuit;
(c) at least one electrode array configured for receiving drive voltage/current from said electrode driver circuit, said electrode array configured for being implanted in a patient for innervating a patient's bone marrow;
(d) wherein said control circuit is configured for converting said stimulation parameters into a series of basic building block waveforms (BBWs) with amplitudes, pulse width, inter-pulse delay, and stimulation frequencies according to said stimulation parameters, and outputting waveform signals, having pulse trains (PTs), each PT of which comprises a series of N basic building waveforms (BBWs), which are output to said electrode driver circuit;
(e) wherein said electrode driver circuit is configured for receiving said waveform signals from said control circuit, and for driving said electrode array with a temporal pattern having single pulses and multiple pulse groups separated by inter-pulse intervals, wherein each said electrode in said electrode array is spatially directed with a focusing pattern in which different electrodes of the array can be driven at different amplitudes from positive to negative, toward creating an optimal electrode array montage of electrical stimulation; and
(f) whereby said electrical stimulation is configured to trigger nerve fibers that innervate patient bone marrow toward preserving its microenvironments after chemotherapy toward reducing hematologic toxicity and mortality; and
(g) wherein said control circuit in combination with said electrode driver circuit are configured for selectively applying electrical pulses to said at least one electrode array in a waveform consisting of:
(i) a frequency from 2 Hz to approximately 100 Hz;
(ii) a duration of each phasic pulse of approximately 0.05 ms to approximately 3 ms;
(iii) a pulse train having a stimulation on period of 1 to 5 seconds, at a frequency of 2 Hz to 100 Hz, and a stimulation off period of 1 second to 10 seconds;
(iv) a pulse train amplitude of 0.05 mA to 200 mA; and
(v) a simulation duration of 1 minute to 90 minutes with a repeating pattern pulse train.

21. The apparatus of claim 20, wherein said chemotherapy comprises a chemotherapy treatment in which carboplatin is administered.

22. The apparatus of claim 20, wherein said electrode array is configured for being implanted to access sympathetic nerves, or spleen, or the vagus nerve and its associated branches.

23. The apparatus of claim 22, wherein said electrode driver circuit is also configured for being implanted.

24. The apparatus of claim 23, wherein said control circuit is also configured for being implanted.

25. The apparatus of claim 20, wherein a one-shot-protocol (OSP) is performed comprising a pulse train (PT) followed by an idle latency of the one-shot period (P) minus active portion of stimulation waveform (N).

26. The apparatus of claim 25, wherein said OSP is repeatedly generated until a counter D has expired ending the protocol.

27. The apparatus of claim 20, wherein said pulse width is randomized toward enhancing stimulation performance.

28. The apparatus of claim 20, wherein said inter-pulse intervals comprise constant and/or randomized inter-pulse intervals.

29. The apparatus of claim 20, wherein said control circuit is configured to allow changing the basic building waveforms of the pulse trains every P periods.

30. The apparatus of claim 20, wherein said stimulation parameters specifying stimulation waveforms comprise specifications for polarity including leading cathodic or anodic, mode as to whether output levels are directed to voltage or current, indicating if the waveform is bi-phasic and whether it is symmetric bi-phasic or asymmetric biphasic), waveforms amplitudes, pulse widths, and delay times.

31. The apparatus of claim 20, wherein said basic building block waveforms comprise mono-phasic stimulation as cathodic stimulation, mono-phasic stimulation as anodic stimulation, bi-phasic stimulation pulses with balanced symmetry as cathodic leading, bi-phasic stimulation pulses with balanced symmetry as anodic leading, bi-phasic stimulation pulses with balanced asymmetry as cathodic leading, and bi-phasic stimulation pulses with balanced asymmetry as anodic leading.

32. The apparatus of claim 20, wherein said waveform signals are generated in the form of natural biomimetic waveforms which mimic biological signals representing firing sequences and oscillation patterns by a neuron or a cluster system of neurons.

33. The apparatus of claim 20, wherein said waveform signals are generated in the form of synthetic biomimetic waveforms with randomized interphasic delay, pulse width and amplitude at either a Poisson or Gaussian distribution.

34. The apparatus of claim 20, wherein said controller circuit comprises a sequencing circuit.

35. The apparatus of claim 34, wherein said sequencing circuit is selected from the group of sequencing circuits consisting of a microcontroller containing firmware, System-on-Chip (SoC), Application-Specific Integrated Circuit (ASIC), and combinations thereof.

36. The apparatus of claim 20, wherein said electrode driver circuit comprises at least one multi-bit digital-analog converter (DAC) outputting a signal to a current mirror for inducing an output current/voltage to the attached at least one electrode.

37. The apparatus of claim 20, wherein said electrode driver circuit is further configured with a power and data management circuit comprising at least one regulator, at least one rectifier, at least one voltage and/or current converter, and at least one data buffer.

38. The apparatus of claim 20, wherein said pulse train is generated as a repeating pattern pulse train.

39. The apparatus of claim 20, wherein said control circuit is configured for communicating with said electrode driver circuit with either wired, or wireless, communications.

40. The apparatus of claim 20, wherein said control circuit is configured for communicating with a user interface with either wired, or wireless, communications.

41. The apparatus of claim 20:
wherein said at least one electrode array comprises an electrode array with a first dimension having from 3 to 9 electrodes, and a second dimension having from 3 to 9 electrodes; and
wherein said controller circuit is configured for controlling said electrode driver circuit in establishing a stimulation current montage to focus on a targeted nerve.

42. A method for reducing chemotherapy impacts on hematopoiesis, the method comprising:
(a) receiving stimulation parameters from a user interface of a control circuit;
(b) converting said stimulation parameters into a series of basic building block waveforms (BBWs) with amplitudes, pulse width, inter-pulse delay, and stimulation frequencies according to said stimulation parameters;
(c) generating waveform signals from said BBWs and outputting said waveform signals having pulse trains (PTs), each PT of which comprises a series of N basic building waveforms (BBWs), configured for output to an electrode driver circuit;
(d) performing electrical stimulation in a treatment for innervating a patient's bone marrow to reduce chemotherapy impacts on hematopoiesis in response to driving an implanted electrode array with a temporal pattern of said waveform signals having single pulses and multiple pulse groups separated by inter-pulse intervals, wherein each said electrode in said electrode array is spatially directed with a focusing pattern in which different electrodes of the array can be driven at different amplitudes from positive to negative, toward creating an optimal electrode array montage of electrical stimulation; and
(e) whereby said electrical stimulation triggers nerve fibers that innervate patient bone marrow toward preserving its microenvironments after chemotherapy toward reducing hematologic toxicity and mortality.

43. The method of claim 42, wherein said treatment comprises multiple cycles of electrical stimulation (ES) within a treatment cycle.

44. The method of claim 43, wherein said treatment comprises three cycles of electrical stimulation (ES) within a treatment cycle.

45. The method of claim 44, wherein said treatment cycle comprises 28 days.

46. The method of claim 42, wherein said waveform signals are generated comprising:
(a) generating a pulse train of phasic pulses having a frequency from 2 Hz to 100 Hz, with each phasic pulse having a duration of 0.05 ms to 3 ms;
(b) generating said pulse train having a stimulation on period of 1 to 5 seconds, and a stimulation off period of 1 second to 10 seconds;
(c) generating said pulse train with amplitudes of from 0.05 mA to 200 mA; and
(d) generating a stimulation duration of said pulse train for 1 minute to 90 minutes with a repeating pattern pulse train.

47. The method of claim 42, further comprising generating said waveform signals as natural biomimetic waveforms which mimic biological signals representing firing sequences and oscillation patterns by a neuron or a cluster system of neurons.

48. The method of claim 42, further comprising generating said waveform signals as synthetic biomimetic waveforms with randomized interphasic delay, pulse width and amplitude at either a Poisson or Gaussian distribution.

\* \* \* \* \*